US012776373B2

(12) United States Patent
Qi et al.

(10) Patent No.: US 12,776,373 B2
(45) Date of Patent: Oct. 27, 2026

(54) MANAGING PROGRAM TIME IN MEMORY DEVICES

(71) Applicant: Yangtze Memory Technologies Co., Ltd., Wuhan (CN)

(72) Inventors: Wei Qi, Wuhan (CN); Guoqi Ji, Wuhan (CN); Yong Nie, Wuhan (CN); Da Li, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 132 days.

(21) Appl. No.: 18/911,190

(22) Filed: Oct. 9, 2024

(65) Prior Publication Data

US 2026/0088090 A1 Mar. 26, 2026

(30) Foreign Application Priority Data

Sep. 20, 2024 (CN) ........................ 202411320794.X

(51) Int. Cl.
*G11C 16/04* (2006.01)
*G11C 16/08* (2006.01)
*G11C 16/10* (2006.01)

(52) U.S. Cl.
CPC .......... *G11C 16/10* (2013.01); *G11C 16/0483* (2013.01); *G11C 16/08* (2013.01)

(58) Field of Classification Search
CPC ..... G11C 16/10; G11C 16/0483; G11C 16/08; G11C 11/5628; G11C 16/32; G11C 16/3427
See application file for complete search history.

(56) References Cited

U.S. PATENT DOCUMENTS

| | | | | |
|---|---|---|---|---|
| 9,245,637 | B2 * | 1/2016 | Yang | G11C 16/3427 |
| 10,388,390 | B2 * | 8/2019 | Costa | G11C 16/0483 |
| 2011/0026331 | A1 | 2/2011 | Dong et al. | |
| 2018/0012667 | A1 * | 1/2018 | Costa | G11C 16/0483 |
| 2021/0383879 | A1 | 12/2021 | Lin et al. | |
| 2023/0410920 | A1 | 12/2023 | Chen et al. | |

FOREIGN PATENT DOCUMENTS

| | | | |
|---|---|---|---|
| CN | 113517017 | A | 10/2021 |
| CN | 114333954 | A | 4/2022 |

OTHER PUBLICATIONS

Office Action in Chinese Appln. No. 202411320794.X, mailed on Jul. 31, 2026, 15 pages (with machine translation).

* cited by examiner

*Primary Examiner* — Mohammed A Bashar
(74) *Attorney, Agent, or Firm* — Hanley, Flight & Zimmerman, LLC

(57) ABSTRACT

Methods, devices, and systems for managing memory devices are provided. In one aspect, a method includes, during a first loop of a program operation, applying a first program voltage to a first word line, applying, to a second word line, a first pass voltage during a first stage and a second pass voltage during a second stage; during a second loop, applying a second program voltage to the first word line, applying, to the second word line, a third pass voltage during a first stage and a fourth pass voltage during a second stage; and during a third loop, applying a third program voltage to the first word line, applying, to the second word line, a fifth pass voltage during a first stage and a sixth pass voltage during a second stage. The third pass voltage is lower than the first pass voltage and the fifth pass voltage.

20 Claims, 21 Drawing Sheets

| Pulse | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|
| P1 | V | V | V | V | V | V | V | V | | | | | | | | | | | | | | | |
| P2 | | | | | | | V | V | V | V | V | | | | | | | | | | | | |
| P3 | | | | | | | | | V | V | V | V | V | | | | | | | | | | |
| P4 | | | | | | | | | | | V | V | V | V | V | | | | | | | | |
| P5 | | | | | | | | | | | | | V | V | V | V | V | V | | | | | |
| P6 | | | | | | | | | | | | | | | | V | V | V | V | V | | | |
| P7 | | | | | | | | | | | | | | | | | | | V | V | V | V | |

MANAGING PROGRAM TIME IN MEMORY DEVICES

CROSS-REFERENCE TO RELATED APPLICATIONS

This application claims priority to Chinese Patent Application No. 202411320794.X, filed on Sep. 20, 2024, which is hereby incorporated by reference in its entirety.

TECHNICAL FIELD

The present disclosure generally relates to memory devices and memory systems, and in particular, to managing program times in memory devices.

BACKGROUND

Flash memory is a low-cost, high-density, nonvolatile solid-state storage medium that can be electrically erased and reprogrammed. Flash memory includes NOR flash memory and NAND flash memory. Various operations can be performed by flash memory, for example, program (write) and erase operations, to change the threshold voltage of each memory cell to a respective level. For NAND flash memory, an erase operation can be performed at the block level, a program operation can be performed at the page level, and a read operation can be performed at the page level.

SUMMARY

The present disclosure involves methods, apparatuses, and systems for managing program time in memory devices. One aspect of the present disclosure features a method of operating a memory device. The method includes, during a first loop of a program operation to program memory cells coupled to a first word line, applying a first program voltage to the first word line; applying, during a first stage of the first loop, a first pass voltage to at least one second word line; and applying, during a second stage of the first loop, a second pass voltage to the at least one second word line. The second stage is after the first stage. The method further includes, during a second loop of the program operation, applying a second program voltage to the first word line, applying, during a first stage of the second loop, a third pass voltage to the at least one second word line; and applying, during a second stage of the second loop, a fourth pass voltage to the at least one second word line. The second loop is after the first loop, the second program voltage is higher than the first program voltage, and a difference between the fourth pass voltage and the third pass voltage is greater than a difference between the second pass voltage and the first pass voltage.

The present disclosure involves methods, apparatuses, and systems for managing program time in memory devices. One aspect of the present disclosure features a method of operating a memory device. The method includes, during a first loop of a program operation to program memory cells coupled to a first word line, applying a first program voltage to the first word line, applying, during a first stage of the first loop, a first pass voltage to at least one second word line, and applying, during a second stage of the first loop, a second pass voltage to the at least one second word line. The second stage is after the first stage. The method further includes, during a second loop of the program operation, applying a second program voltage to the first word line, applying, during a first stage of the second loop, a third pass voltage to the at least one second word line, and applying, during a second stage of the second loop, a fourth pass voltage to the at least one second word line. The second loop is after the first loop, the second program voltage is higher than the first program voltage, and a difference between the fourth pass voltage and the third pass voltage is greater than a difference between the second pass voltage and the first pass voltage.

In some implementations, the memory device includes word lines numbered in sequence. The first word line is the nth word line of the word lines, the at least one second word line includes at least one of the $(n+1)^{th}$ or the $(n-1)^{th}$ word line of the word lines, where n is a positive integer.

In some implementations, a first voltage of the first word line during the first stage of the second loop is lower than a second voltage of the first word line during the second stage of the second loop.

In some implementations, the third pass voltage is lower than the first pass voltage, and the fourth pass voltage is equal to the second pass voltage.

In some implementations, the third pass voltage is equal to the first pass voltage, and the fourth pass voltage is higher than the second pass voltage.

In some implementations, the first pass voltage is lower than or equal to the second pass voltage.

In some implementations, the first loop and the second loop each include a third stage between the first stage and the second stage. The method further includes applying a fifth pass voltage to the at least one second word line during the third stage of the first loop, and applying a sixth pass voltage to the at least one second word line during the third stage of the second loop. The sixth pass voltage is lower than the fifth pass voltage.

In some implementations, a difference between the fifth pass voltage and the sixth pass voltage is smaller than a difference between the fourth pass voltage and the second pass voltage.

In some implementations, the first pass voltage, the second pass voltage, and the fifth pass voltage are equal.

In some implementations, the fifth pass voltage is higher than the first pass voltage, and the second pass voltage is higher than the fifth pass voltage.

In some implementations, the first loop and the second loop each include a third stage between the first stage and the second stage. The method further includes applying a fifth pass voltage to the at least one second word line during the third stage of the first loop, and applying a sixth pass voltage to the at least one second word line during the third stage of the second loop. The sixth pass voltage is higher than the fifth pass voltage.

In some implementations, the program operation includes a set of loops each including a first stage and a second stage after the first stage. As the program operation progresses to a later loop, a difference between a pass voltage applied to the at least one second word line during the second stage of a loop and a pass voltage applied to the at least one second word line during the first stage of the loop increases.

Another aspect of the present disclosure features a memory device. The memory device includes a memory array including a first word line and at least one second word line, and a peripheral circuit coupled to the memory array. The peripheral circuit is configured to perform operations including, during a first loop of a program operation to program memory cells coupled to the first word line, applying a first program voltage to the first word line, applying, during a first stage of the first loop, a first pass voltage to the at least one second word line, and applying, during a second stage of the first loop, a second pass voltage to the at least one second word line. The second stage is after the first stage. The operations further include, during a second loop of the program operation, applying a second program voltage to the first word line, applying, during a first stage of the second loop, a third pass voltage to the at least one second word line, and applying, during a second stage of the second loop, a fourth pass voltage to the at least one second word line. The second loop is after the first loop, the second program voltage is higher than the first program voltage, a difference between the fourth pass voltage and the third pass voltage is greater than a difference between the second pass voltage and the first pass voltage.

In some implementations, the memory device includes word lines numbered in sequence. The first word line is the nth word line of the word lines, the at least one second word line includes at least one of the $(n+1)^{th}$ or the $(n-1)^{th}$ word line of the word lines, where n is a positive integer.

In some implementations, a first voltage of the first word line during the first stage of the second loop is lower than a second voltage of the first word line during the second stage of the second loop.

In some implementations, the third pass voltage is lower than the first pass voltage, and the fourth pass voltage is equal to the second pass voltage.

In some implementations, the third pass voltage is equal to the first pass voltage, and the fourth pass voltage is higher than the second pass voltage.

In some implementations, the first loop and the second loop each include a third stage between the first stage and the second stage. The operations further include applying a fifth pass voltage to the at least one second word line during the third stage of the first loop, and applying a sixth pass voltage to the at least one second word line during the third stage of the second loop. The sixth pass voltage is lower than the fifth pass voltage.

In some implementations, a difference between the fifth pass voltage and the sixth pass voltage is smaller than a difference between the fourth pass voltage and the second pass voltage.

Another aspect of the present disclosure features a memory system. The memory system includes a memory device and a memory controller coupled to the memory device and configured to control the memory device. The memory device includes a memory array including a first word line and at least one second word line, and a peripheral circuit coupled to the memory array. The peripheral circuit is configured to perform operations including, during a first loop of a program operation to program memory cells coupled to the first word line, applying a first program voltage to the first word line, applying, during a first stage of the first loop, a first pass voltage to the at least one second word line, and applying, during a second stage of the first loop, a second pass voltage to the at least one second word line. The second stage is after the first stage. The operations further include, during a second loop of the program operation, applying a second program voltage to the first word line, applying, during a first stage of the second loop, a third pass voltage to the at least one second word line, and applying, during a second stage of the second loop, a fourth pass voltage to the at least one second word line. The second loop is after the first loop, the second program voltage is higher than the first program voltage, a difference between the fourth pass voltage and the third pass voltage is greater than a difference between the second pass voltage and the first pass voltage.

Another aspect of the present disclosure features a method of operating a memory device. The method includes, during a first loop of a first program operation to program memory cells coupled to a first word line, applying a first program voltage to the first word line, applying, during a first stage of the first loop, a first pass voltage to at least one second word line, and applying, during a second stage of the first loop, a second pass voltage to the at least one second word line. The second stage is after the first stage. The method further includes, during a second loop of the first program operation, applying a second program voltage to the first word line, applying, during a first stage of the second loop, a third pass voltage to the at least one second word line, and applying, during a second stage of the second loop, a fourth pass voltage to the at least one second word line. The method further includes, during a third loop of the first program operation, applying a third program voltage to the first word line, applying, during a first stage of the third loop, a fifth pass voltage to the at least one second word line, and applying, during a second stage of the third loop, a sixth pass voltage to the at least one second word line. The second loop is after the first loop, the third loop is after the second loop, the second program voltage is higher than the first program voltage, and the third program voltage is higher than the second program voltage. The third pass voltage is lower than the first pass voltage, and the fifth pass voltage is higher than the third pass voltage.

In some implementations, the memory device includes word lines numbered in sequence. The first word line is the nth word line of the word lines, the at least one second word line includes at least one of the $(n+1)^{th}$ or the $(n-1)^{th}$ word line of the word lines, where n is a positive integer.

In some implementations, the second pass voltage, the fourth pass voltage, and the sixth pass voltage are identical.

In some implementations, a difference between the second pass voltage and the first pass voltage is smaller than a difference between the fourth pass voltage and the third pass voltage, and the difference between the fourth pass voltage and the third pass voltage is greater than a difference between the sixth pass voltage and the fifth pass voltage.

In some implementations, a first voltage of the first word line during the first stage of the second loop is lower than a second voltage of the first word line during the second stage of the second loop.

In some implementations, the method further includes applying, during a first stage of a fourth loop of the first program operation, the fifth pass voltage to the at least one second word line. The fourth loop is after the third loop.

In some implementations, the method includes, during a first loop of a second program operation to program memory cells coupled to a third word line, applying a fourth program voltage to the third word line, applying, during a first stage of the first loop of the second program operation, a seventh pass voltage to at least one fourth word line, and applying, during a second stage of the first loop of the second program operation, an eighth pass voltage to the at least one fourth word line. The second stage is after the first stage. The method further includes, during a second loop of the second program operation, applying a fifth program voltage to the third word line, applying, during a first stage of the second loop of the second program operation, a ninth pass voltage to the at least one fourth word line, and applying, during a second stage of the second loop of the second program operation, a tenth pass voltage to the at least one fourth word line. The method further includes, during a third loop of the second program operation, applying a sixth program voltage to the third word line, applying, during a first stage of the third loop of the second program operation, an eleventh pass voltage to the at least one fourth word line, and applying, during a second stage of the third loop of the second program operation, a twelfth pass voltage to the at least one fourth word line. The first loop, the second loop, and the third loop of the second program operation are sequential to each other. The fifth program voltage is higher than the fourth program voltage, and the sixth program voltage is higher than the fifth program voltage. A difference between the eighth pass voltage and the seventh pass voltage, a difference between the tenth pass voltage and the ninth pass voltage, and a difference between the twelfth pass voltage and the eleventh pass voltage are identical to each other.

In some implementations, the seventh pass voltage, the ninth pass voltage, and the eleventh pass voltage are identical to each other. The eighth pass voltage, the tenth pass voltage, and the twelfth pass voltage are identical to each other.

In some implementations, the ninth pass voltage is higher than the seventh pass voltage, and the eleventh pass voltage is higher than the ninth pass voltage. The tenth pass voltage is higher than the eighth pass voltage, and the twelfth pass voltage is higher than the tenth pass voltage.

In some implementations, the memory device includes word lines numbered in sequence. The third word line is the $m^{th}$ word line of the word lines. The at least one fourth word line includes at least one of the $(m+1)^{th}$ or the $(m-1)^{th}$ word line of the word lines, where m is a positive integer.

In some implementations, the memory device includes word lines in sequence from a first side to a second side along a direction, and the word lines of the memory device include a first set of word lines and a second set of word lines. The second set of word lines are closer to the second side of the memory device than the first set of word lines along the direction. The first set of word lines includes the first word line, and the second set of word lines includes the third word line.

In some implementations, the second set of word lines include about 10 word lines.

In some implementations, a deck of the memory device includes a first side and a second side along a direction, and word lines of the deck include a third set of word lines and a fourth set of word lines. The third set of word lines are closer to the first side of the deck than the fourth set of word lines. The third set of word lines includes the third word line, and the fourth set of word lines includes the first word line.

In some implementations, the third set of word lines include about 10 word lines.

Another aspect of the present disclosure features a memory device. The memory device includes a memory array including a first word line and at least one second word line, and a peripheral circuit coupled to the memory array. The peripheral circuit is configured to perform operations including, during a first loop of a first program operation to program memory cells coupled to a first word line, applying a first program voltage to the first word line, applying, during a first stage of the first loop, a first pass voltage to at least one second word line, and applying, during a second stage of the first loop, a second pass voltage to the at least one second word line. The second stage is after the first stage. The operations further include, during a second loop of the first program operation, applying a second program voltage to the first word line, applying, during a first stage of the second loop, a third pass voltage to the at least one second word line, and applying, during a second stage of the second loop, a fourth pass voltage to the at least one second word line. The operations further include, during a third loop of the first program operation, applying a third program voltage to the first word line, applying, during a first stage of the third loop, a fifth pass voltage to the at least one second word line, and applying, during a second stage of the third loop, a sixth pass voltage to the at least one second word line. The second loop is after the first loop, the third loop is after the second loop, the second program voltage is higher than the first program voltage, and the third program voltage is higher than the second program voltage. The third pass voltage is lower than the first pass voltage, and the fifth pass voltage is higher than the third pass voltage.

In some implementations, the memory device includes word lines numbered in sequence. The first word line is the nth word line of the word lines, the at least one second word line includes at least one of the $(n+1)^{th}$ or the $(n-1)^{th}$ word line of the word lines, where n is a positive integer.

In some implementations, a difference between the second pass voltage and the first pass voltage is smaller than a difference between the fourth pass voltage and the third pass voltage, and the difference between the fourth pass voltage and the third pass voltage is greater than a difference between the sixth pass voltage and the fifth pass voltage.

In some implementations, the operations further include, during a first loop of a second program operation to program memory cells coupled to a third word line, applying a fourth program voltage to the third word line, applying, during a first stage of the first loop of the second program operation, a seventh pass voltage to at least one fourth word line, and applying, during a second stage of the first loop of the second program operation, an eighth pass voltage to the at least one fourth word line. The second stage is after the first stage. The operations further include, during a second loop of the second program operation, applying a fifth program voltage to the third word line, applying, during a first stage of the second loop of the second program operation, a ninth pass voltage to the at least one fourth word line, and applying, during a second stage of the second loop of the second program operation, a tenth pass voltage to the at least one fourth word line. The operations further include, during a third loop of the second program operation, applying a sixth program voltage to the third word line, applying, during a first stage of the third loop of the second program operation, an eleventh pass voltage to the at least one fourth word line, and applying, during a second stage of the third loop of the second program operation, a twelfth pass voltage to the at least one fourth word line. The first loop, the second loop, and the third loop of the second program operation are sequential to each other. The fifth program voltage is higher than the fourth program voltage, and the sixth program voltage is higher than the fifth program voltage. A difference between the eighth pass voltage and the seventh pass voltage, a difference between the tenth pass voltage and the ninth pass voltage, and a difference between the twelfth pass voltage and the eleventh pass voltage are identical to each other.

In some implementations, the memory device includes word lines numbered in sequence. The third word line is the $m^{th}$ word line of the word lines, the at least one fourth word line includes at least one of the $(m+1)^{th}$ or the $(m-1)^{th}$ word line of the word lines, where m is a positive integer.

Another aspect of the present disclosure features a memory system. The memory system includes a memory device and a memory controller coupled to the memory device and configured to control the memory device. The memory device includes a memory array including a first word line and at least one second word line, and a peripheral circuit coupled to the memory array. The peripheral circuit is configured to perform operations including, during a first loop of a first program operation to program memory cells coupled to a first word line, applying a first program voltage to the first word line, applying, during a first stage of the first loop, a first pass voltage to at least one second word line, and applying, during a second stage of the first loop, a second pass voltage to the at least one second word line. The second stage is after the first stage. The operations further include, during a second loop of the first program operation, applying a second program voltage to the first word line, applying, during a first stage of the second loop, a third pass voltage to the at least one second word line, and applying, during a second stage of the second loop, a fourth pass voltage to the at least one second word line. The operations further include, during a third loop of the first program operation, applying a third program voltage to the first word line, applying, during a first stage of the third loop, a fifth pass voltage to the at least one second word line, and applying, during a second stage of the third loop, a sixth pass voltage to the at least one second word line. The second loop is after the first loop, the third loop is after the second loop, the second program voltage is higher than the first program voltage, and the third program voltage is higher than the second program voltage. The third pass voltage is lower than the first pass voltage, and the fifth pass voltage is higher than the third pass voltage.

While generally described as computer-implemented software embodied on tangible media that processes and transforms the respective data, some or all of the aspects may be computer-implemented methods or further included in respective systems or other devices for performing this described functionality. The details of these and other aspects and implementations of the present disclosure are set forth in the accompanying drawings and the description below. Other features, objects, and advantages of the disclosure will be apparent from the description and drawings, and from the claims.

BRIEF DESCRIPTION OF DRAWINGS

Like reference numbers and designations in the various drawings indicate like elements.

DETAILED DESCRIPTION

Figure 1:
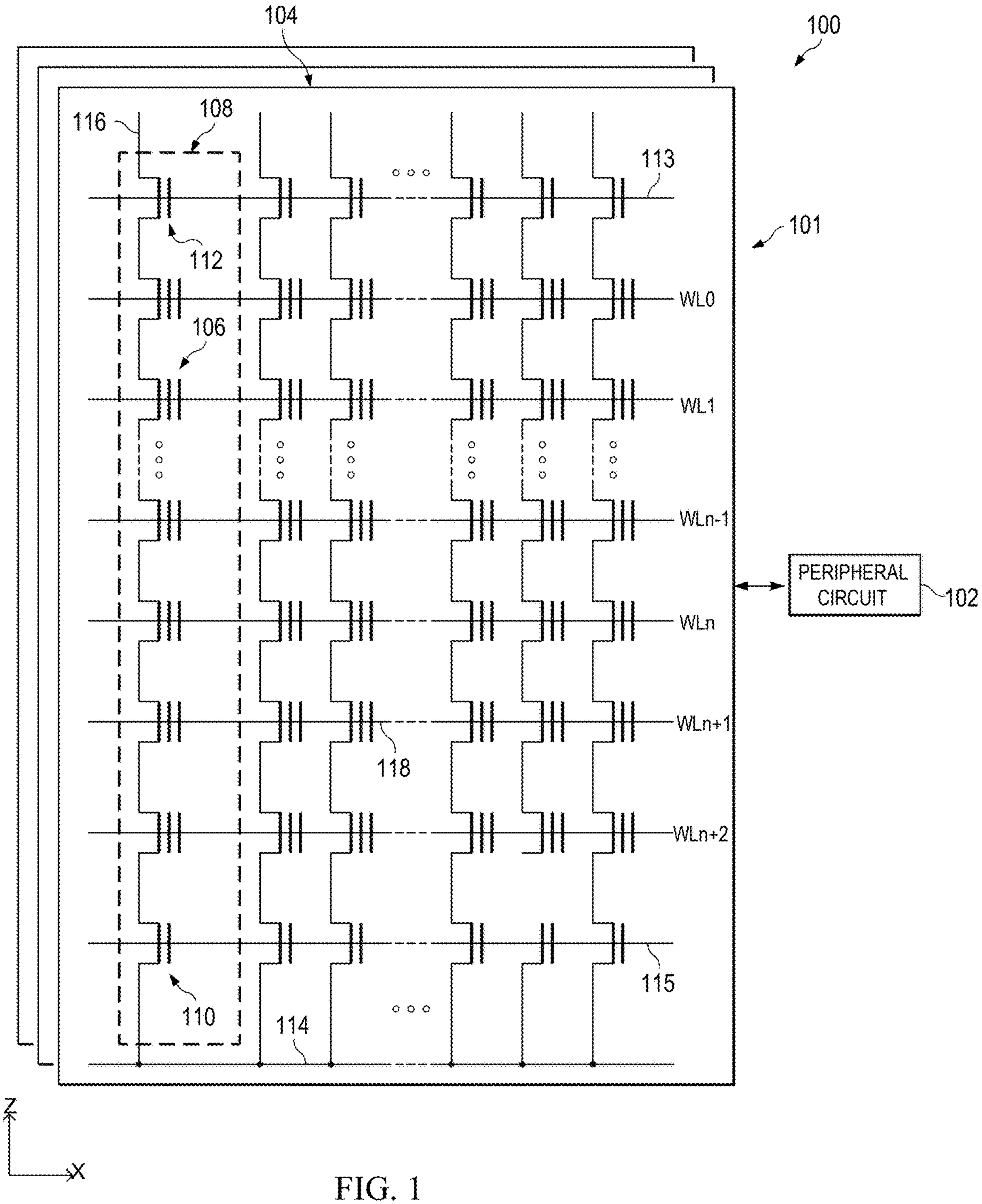
FIG. 1 illustrates a schematic diagram of an example memory device including peripheral circuits.

This specification relates to memory devices, memory systems, and methods for managing program time in memory devices, e.g., NAND flash memory devices. Due to a demand for memory devices with better performance, program time (e.g., time spent or needed to perform a program operation) of the memory devices needs to be further improved.

A program operation using an incremental step pulse programming (ISPP) scheme can include a plurality of loops. As the program operation progresses from an early loop to a later loop, program voltage applied on the selected word line increases by incremental steps. Each loop can include a first stage and a second stage. In one loop, the pass voltage applied to a word line adjacent to the selected word line during the second stage can be higher than the pass voltage applied to the adjacent word line during the first stage. As a result, due to a coupling effect, a voltage of the selected word line can ramp up a higher voltage, so that the memory cells can be programmed more sufficiently during the loop. As such, program time can be reduced to some extent.

The present disclosure provides techniques to further reduce program time of a memory device. In some implementations, as the program operation progresses from an early loop to a later loop, the difference (ΔV) between the pass voltage applied to an adjacent word line during the second stage and during the first stage can increase. Therefore, during a later loop, the coupling effect can be stronger, so that the voltage of the selected word line can ramp up faster to a higher voltage, compared to the scenario where ΔV remains constant from the early loop to the later loop. As such, program time can be further reduced.

The plurality of loops of the program operation can be divided into early loops, middle loops, and terminal loops. In some implementations, ΔV increases as the program operation progresses from an early loop to a middle loop, and ΔV remains constant as the program operation progresses from the middle loop to a terminal loop. As such, program time can be reduced while managing the risk of breaking down memory cells.

In some implementations, different program schemes can be implemented to program different word lines. For example, during a first program operation to program a word line that is susceptible to program interference, the memory device can implement a first program scheme where ΔV remains constant from an early loop to a later loop. During a second program operation to program a word line that needs stronger coupling effect, the memory device can implement a second program scheme where ΔV increases from an early loop to a later loop. As such, program time can be reduced while managing the risk of read margin loss due to program interference.

Techniques implemented in the present disclosure can provide one or more of the following technical advantages and/or benefits. For example, the techniques can reduce program time of a memory device, which can improve the efficiency of the memory device. Further, program time of the memory device can be reduced by controlling voltages on word lines, which is cost efficient. For another example, by using different program schemes to program different word lines, program time can be reduced while balancing other performance requirements, such as program interference, read margin, and breakdown risk. In some implementations, different or more technical advantages may be achieved.

The techniques can be applied to various types of semiconductor devices, e.g., nonvolatile memory (NVM) devices (such as NAND flash memory or NOR flash memory), volatile memory devices (such as DRAM memory devices), resistive random-access memory (RRAM), phase-change memory (PCM) such as phase-change random-access memory (PCRAM), spin-transfer torque (STT)-Magnetoresistive random-access memory (MRAM), among others. The techniques can also be applied to charge-trapping based memory devices, e.g., silicon-oxide-nitride-oxide-silicon (SONOS) memory devices, and floating-gate based memory devices. The techniques can be applied to three-dimensional (3D) memory devices. The techniques can be applied to various memory types, such as SLC (single-level cell) devices, MLC (multi-level cell) devices like 2-level cell devices, TLC (triple-level cell) devices, QLC (quad-level cell) devices, or PLC (penta-level cell) devices. Additionally or alternatively, the techniques can be applied to various types of devices and systems, such as secure digital (SD) cards, embedded multimedia cards (eMMC), universal flash storage (UFS), or solid-state drives (SSDs), embedded systems, among others.

FIG. 1 illustrates a schematic circuit diagram of an example memory device 100 including peripheral circuits. The memory device 100 can include a memory array 101 and peripheral circuits 102 coupled to the memory array 101. The memory array 101 can be a NAND Flash memory array further includes one or more blocks 104. Memory cells 106 are provided in the form of an array of memory strings 108 each extending vertically above a substrate (not shown in FIG. 1). In some implementations, each memory string 108 includes a plurality of memory cells 106 coupled in series and stacked vertically. Each memory cell 106 can hold a continuous, analog value, such as an electrical voltage or charge that depends on the number of electrons trapped within a storage layer of the memory cell 106. The logic state (i.e., data) of each memory cell 106 in the block 104 can be determined based on the threshold voltage Vth of the memory cell 106. Each memory cell 106 can be a floating gate type memory cell including a floating-gate transistor, or a charge trap type memory cell including a charge-trap transistor.

In some implementations, each memory cell 106 is a single-level cell (SLC) with two possible memory states that can store one bit of data. For example, the first memory state "0" can correspond to a first range of voltages, and the second memory state "1" can correspond to a second range of voltages. In some implementations, to increase storage capacity, each memory cell 106 can be a multi-level cell (MLC), a triple-level cell (TLC), or a quad-level cell (QLC). An MLC stores 2 bits of data, and has four logic states, logic {11, 10, 01, and 00}, i.e., erased state, and programmed states P1, P2, and P3. A TLC stores 3 bits of data, and has eight logic states, logic {111, 110, 101, 100, 011, 010, 001, 000}, i.e., erased state, and programmed states P1-P7. A QLC stores 4 bits of data and has 16 logic states, logic {1111, 1110, 1101, 1100, 1011, 1010, 1001, 1000, 0111, 0110, 0101, 0100, 0011, 0010, 0001, 0000}, i.e., erased state and programmed states P1-P15.

As shown in FIG. 1, each memory string 108 can include a source select gate (SSG) 110 at its source end, and a drain select gate (DSG) 112 at its drain end. The SSG 110 and the DSG 112 can be configured to activate selected memory strings 108 (columns of the array) during read and program operations. In some implementations, the sources of memory strings 108 in the same block 104 are coupled through a same source line 114. In other words, memory strings 108 in the same block 104 have an array common source (ACS), according to some implementations. The DSG 112 of each memory string 108 is coupled to a respective bit line 116 from which data can be read or written via an output bus (not shown), according to some implementations. In some implementations, each memory string 108 is configured to be selected or deselected by applying a select voltage (e.g., above the threshold voltage of the transistor having the DSG 112) or a deselect voltage (e.g., 0 V) to the respective DSG 112 through one or more DSG lines 113, and/or by applying a select voltage (e.g., above the threshold voltage of the transistor having the SSG 110) or a deselect voltage (e.g., 0 V) to the respective SSG 110 through one or more SSG lines 115.

As shown in FIG. 1, memory strings 108 can be organized into multiple blocks 104, each of which can have a common source line 114 coupled to the ACS. In some implementations, each block 104 can serve as a basic data unit for erase operations, such that memory cells 106 on the same block 104 are erased at the same time. To erase memory cells 106 in a selected block 104, the source lines 114 coupled to the selected block 104 and unselected blocks in the same plane can be biased with an erase voltage. For example, the erase voltage can be a high positive voltage (e.g., 20 V or more). In some implementations, an erase operation can be performed at a half-block level, a quarter-block level, or a level having any suitable number of blocks or fractions of a block.

The memory cells 106 of adjacent memory strings 108 can be coupled through word lines 118. The word line 118 can select which row of memory cells 106 is affected by read and program operations. In some implementations, the memory cell 106 is a SLC, and each word line 118 is coupled to a page of memory cells 106, which is the basic data unit for program operations. If the memory cell 106 is an MLC that stores two bits of data per cell, each word line 118 can correspond to two pages. If memory cell 106 is a TLC, each word line 118 can correspond to three pages. If memory cell 106 is a QLC, each word line 118 can correspond to four pages. The size of a page in bits is associated with the number of memory strings 108 coupled by word line 118 in a block 104. Each word line 118 can include a gate line coupled to a plurality of control gates (gate electrodes) of a plurality of memory cells 106 in the respective page. Example word lines shown in FIG. 1 include WL0, WL1, . . . , WLn−1, WLn, WLn+1, and WLn+2 that are numbered in sequence between one or more DSG lines 113 and one or more SSG lines 115. In some implementations, the word lines can further include dummy word lines coupled to dummy memory cells.

Peripheral circuits 102 can be coupled to memory array 101 through bit lines 116, word lines 118, source lines 114, SSG lines 115, and DSG lines 113. Peripheral circuits 102 can include any suitable analog, digital, and mixed-signal circuits for facilitating the operations of memory array 101 by applying and sensing voltage signals and/or current signals to and from each target memory cell 106 through bit lines 116, word lines 118, source lines 114, SSG lines 115, and DSG lines 113. Peripheral circuits 102 can include various types of peripheral circuits formed using metal-oxide-semiconductor (MOS) technologies.

Figure 2A:
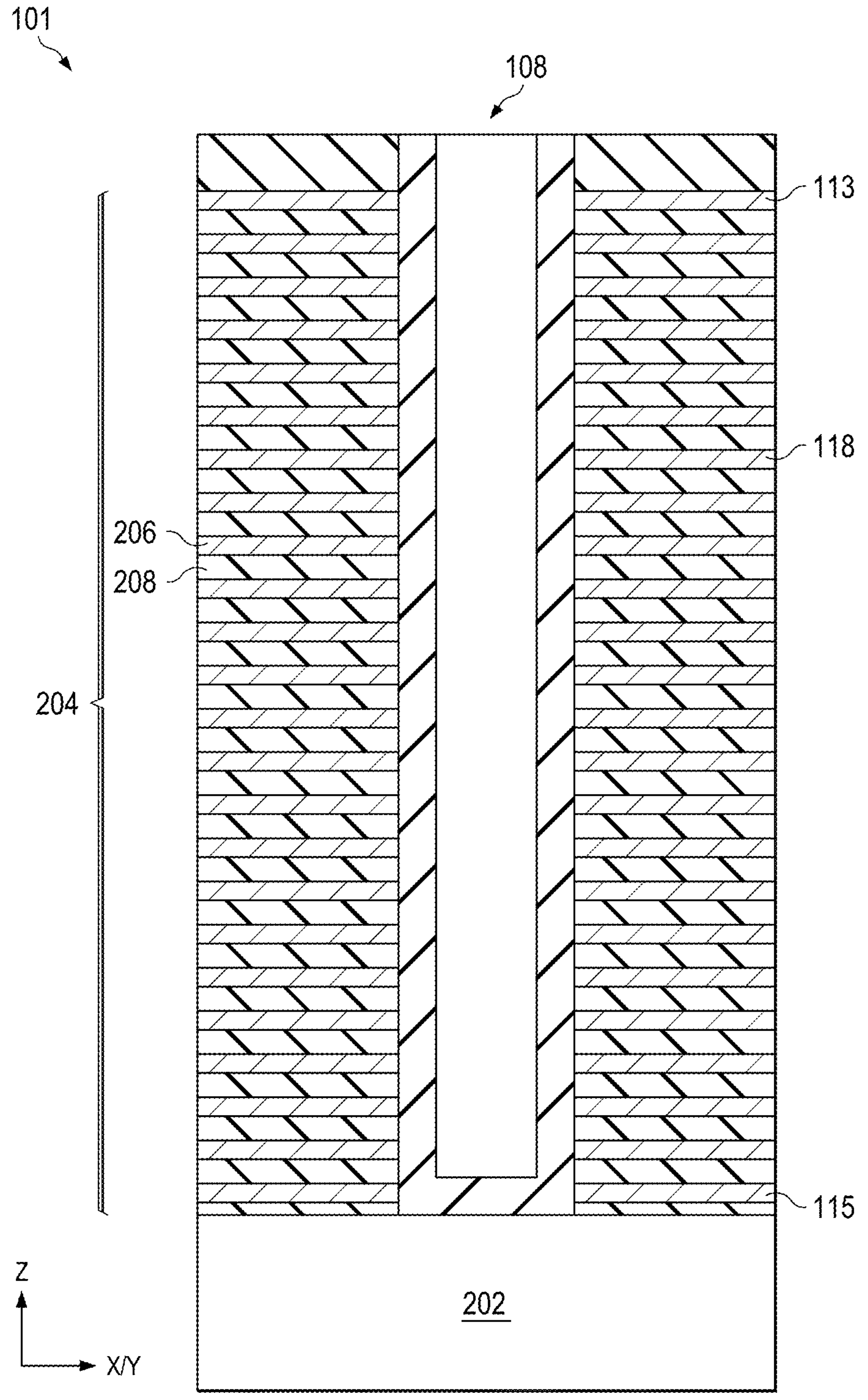
FIG. 2A illustrates a side view of cross-sections of an example memory array including memory strings.

FIG. 2A illustrates a side view of cross-sections of an example memory array 101 including memory strings 108. As shown in FIG. 2A, the memory string 108 can extend vertically through a memory stack 204 above a substrate 202. The substrate 202 can include silicon (e.g., single crystalline silicon), silicon germanium (SiGe), gallium arsenide (GaAs), germanium (Ge), silicon on insulator (SOI), germanium on insulator (GOI), or any other suitable materials.

The memory stack 204 can include pairs of interleaved gate conductive layers 206 and gate-to-gate dielectric layers 208. The quantity of the pairs of the interleaved gate conductive layers 206 and gate-to-gate dielectric layers 208 in a memory stack 204 can determine the quantity of memory cells 106 in the memory array 101. The gate conductive layer 206 can include conductive materials including, but not limited to, one or more of tungsten (W), cobalt (Co), copper (Cu), aluminum (Al), polysilicon, doped silicon, or silicide. In some implementations, each gate conductive layer 206 includes a metal layer, such as a tungsten layer. In some implementations, each gate conductive layer 206 includes a doped polysilicon layer. Each gate conductive layer 206 can include control gates surrounding the memory cells 106, the DSG transistor 112, or the SSG transistor 110, and can extend laterally as the DSG line 113 at the top of memory stack 204, the SSG line 115 at the bottom of memory stack 204, or the word lines 118 between the DSG line 113 and the SSG line 115.

Figure 2B:
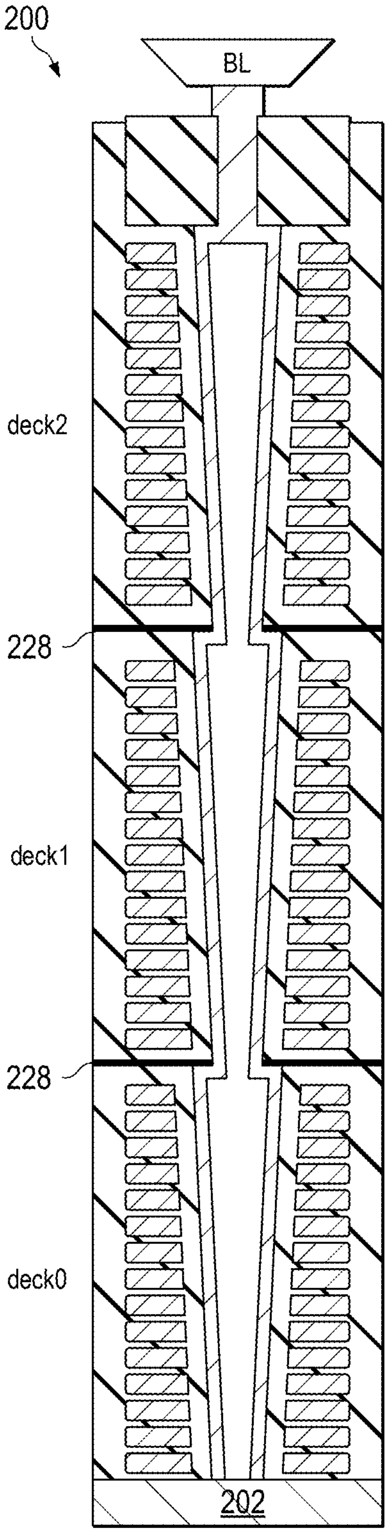
FIG. 2B illustrates an example memory stack that includes multiple decks of memory cells.

FIG. 2B illustrates an example memory stack 200 that includes multiple decks of memory cells. Three example decks of memory cells from the top to the bottom of memory stack 200, i.e., deck2, deck1, and deck0, are shown in FIG. 2B. An example of memory stack 200 is block 104 shown in FIG. 1. Deck2 is positioned above deck1 (e.g., second deck), and deck1 is positioned above deck0. Neighboring decks in FIG. 2B are connected by a joint insulating layer 228. Each deck can include dummy word lines adjacent to the joint insulating layer 228. In some implementations, channel structures of neighboring decks are electrically connected by an inter-deck plug (not shown in FIG. 2B).

In some implementations, program operations in the memory stack 200 can be performed from top to bottom. That is, memory cells coupled to word lines further away from the substrate 202 are programed before the memory cells coupled to word lines closer to the substrate 202. When memory cells in deck1 are being programmed, memory cells in deck 2 have already been programmed, and memory cells in deck0 are not programmed yet. In other implementations, program operations in the memory cell stack 400 can be performed from bottom to top. That is, memory cells coupled to word lines closer to the substrate 202 is programed before the memory cells coupled to word lines further away from the substrate 202. When memory cells in deck1 are being programmed, memory cells in deck 0 have already been programmed, and memory cells in deck2 are not programmed yet.

Figure 3:
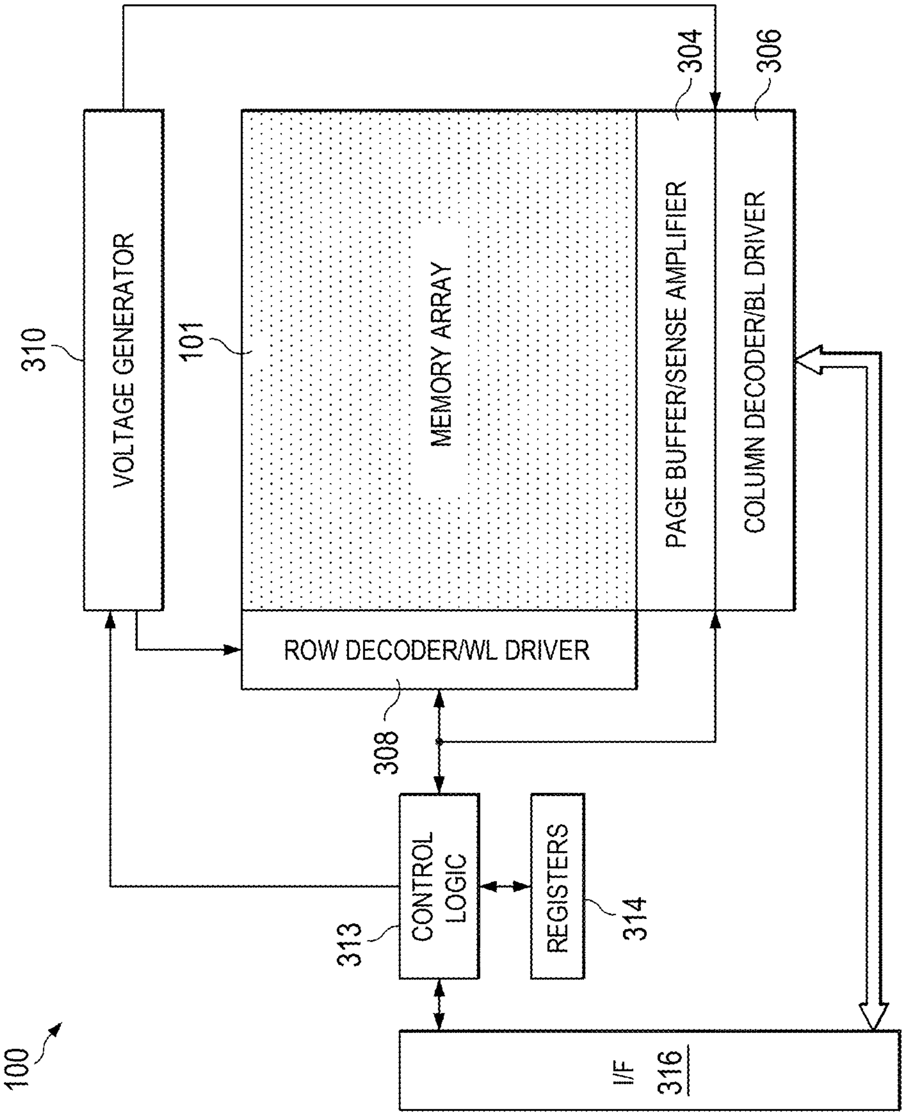
FIG. 3 illustrates some example peripheral circuits.

FIG. 3 illustrates some example peripheral circuits. The example peripheral circuits include a page buffer/sense amplifier 304, a column decoder/bit line driver 306, a row decoder/word line driver 308, a voltage generator 310, control logic 312, registers 314, an interface 316, and a data bus. In some examples, additional peripheral circuits not shown in FIG. 3 may be included as well.

The page buffer/sense amplifier 304 can be configured to read and program (write) data from and to memory array 101 according to the control signals from control logic 312. In an example, the page buffer/sense amplifier 304 may store one page of program data (write data) to be programmed into one page of the memory array 101. In another example, the page buffer/sense amplifier 304 may perform program verification operations to ensure that the data has been properly programmed into memory cells 106 coupled to selected word lines 118. In still another example, the page buffer/sense amplifier 304 may also sense the low power signals from the bit line 116 that represents a data bit stored in memory cell 106, and amplify the small voltage swing to recognizable logic levels in a read operation. The column decoder/bit line driver 306 can be configured to be controlled by the control logic 312 and select one or more memory strings 108 by applying bit line voltages generated from the voltage generator 310.

The row decoder/word line driver 308 can be configured to be controlled by the control logic 312 and select/unselect blocks 104 of the memory array 101 and select/unselect word lines 118 of the block 104. The row decoder/word line driver 308 can be further configured to drive word lines 118 using word line voltages generated from the voltage generator 310. In some implementations, the row decoder/word line driver 308 can also select/unselect and drive SSG lines 115 and DSG lines 113. As described below in detail, the row decoder/word line driver 308 is configured to apply a program voltage to a selected word line 118 in a program operation on memory cell 106 coupled to the selected word line 118.

The voltage generator 310 can be configured to be controlled by the control logic 312 and generate the word line voltages (e.g., read voltage, program voltage, pass voltage, local voltage, verify voltage, etc.), bit line voltages, and source line voltages to be supplied to the memory array 101.

The control logic 312 can be coupled to each peripheral circuit described above and configured to control operations of each peripheral circuit. The registers 314 can be coupled to the control logic 312 and include status registers, command registers, and address registers for storing status information, command operation codes (OP codes), and command addresses for controlling the operations of each peripheral circuit.

The interface 316 can be coupled to the control logic 312 and act as a control buffer to buffer and relay control commands received from a host (not shown) to the control logic 312 and status information received from the control logic 312 to the host. The interface 316 can also be coupled to the column decoder/bit line driver 306 via a data bus, and act as a data input/output (I/O) interface and a data buffer to buffer and relay data to and from the memory array 101.

Figures 4A, 4B:
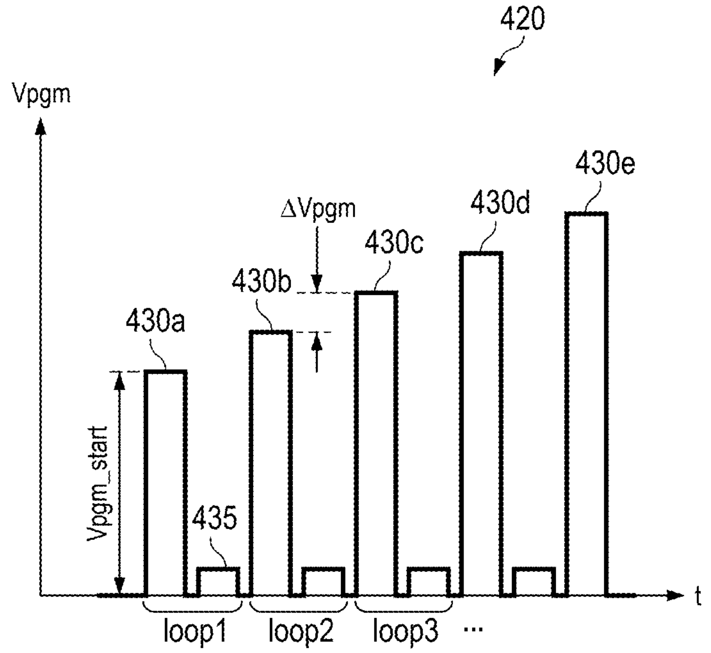
FIG. 4A illustrates an example incremental step pulse programming (ISPP) scheme.
FIG. 4B illustrates an example verification scheme of an example ISPP scheme.

FIG. 4A illustrates an example incremental step pulse programming (ISPP) scheme 420. The ISPP scheme 420 can be applied to a memory device, e.g., the memory device 100 of FIGS. 1 and 3, or the memory device 1804 of FIGS. 18-19B. The ISPP scheme 420 can include a plurality of program pulses 430*a*, 430*b*, 430*c*, 430*d*, 430*c* (collectively as 430). Each program pulse 430 can have a program voltage $V_{pgm}$ (e.g., a voltage between 10 V and 30 V), and can have a pulse length (e.g., a time duration between 1 μs to 30 μs) during which the program voltage is applied. In some implementations, a starting or initial program pulse 430*a* can have a program voltage $V_{pgm\_start}$, and the program voltages of the following program pulses 430*b*, 430*c*, 430*d*, 430*c* each increment by voltage $\Delta V_{pgm}$. The pulse length of the program pulses 430 can be the same. In some implementations, the memory device can apply one or more program pulses 430 to program memory cells 106 to a target programmed state.

As shown in FIG. 4A, a program operation using the ISPP scheme 420 to program memory cells 106 coupled to a selected word line 118 can include a plurality of loops performed in order. Each loop includes a program pulse 430 and a verification pulse 435 that follows the program pulse. That is, in each loop (e.g., loop 1), the memory device can apply a program pulse 430 (e.g., program pulse 430*a*) to the selected word line 118 to program the memory cells 106, and then apply a verification pulse 435 to the selected word line 118 to verify whether the program pulse 430 has programmed memory cells to the target programmed state. If the verification result of the current loop indicates that some or all of the memory cells have not yet been programmed to the target programmed state, these memory cells can be programmed again using the program pulse (e.g., program pulse 430*b*) of a subsequent loop (e.g., loop 2), and verified again using the verification pulse of the subsequent loop. It should be noted that the number of program pulses 430 in the ISPP scheme 420 is for illustrative purpose. The ISPP scheme 420 can include any suitable number of program pulses 430. That is, a program operation using the ISPP scheme 420 can include any suitable number of loops.

FIG. 4B illustrates an example verification scheme of an example ISPP scheme 420. In some implementations, some loops of the program operation can include more than one verification pulse. In other words, in one loop, the memory device can verify whether memory cells have been programmed to each programmed state of more than one programmed state. For example, as shown in FIG. 4B, a program operation to program TLCs can include 23 loops. For the first six loops, each loop includes only one verification pulse 435 after the program pulse 430. The $7^{th}$ loop includes two verification pulses: the first verification pulse can verify whether memory cells have been programmed to programmed state P1, and the second verification pulse can verify whether memory cells 106 have been programmed to programmed state P2. As another example, the $13^{th}$ loop includes three verification pulses: the first verification pulse can verify whether memory cells have been programmed to programmed state P3, the second verification pulse can verify whether memory cells have been programmed to programmed state P4, and the third verification pulse can verify whether memory cells have been programmed to programmed state P5.

In some implementations, the loops of a program operation can be grouped into early loops, middle loops, and terminal loops. For example, first third of the loops (e.g., Loop1 to loop 8 of the 23 loops) can be early loops, the middle third of the loops (e.g., loop 8 to loop 16 of the 23 loops) can be middle loops, and the last third of loops (e.g., loop 17 to loop 23 of the 23 loops) can be terminal loops. Note that the last loop (e.g., the 23rd loop) can include only a program pulse, without a verification pulse.

It should be noted that the verification scheme of FIG. 4B is for illustration purposes only. The verification scheme of ISPP schemes 420 for TLCs can vary, e.g., according to performance needs of specific memory devices. Further, different ISPP schemes with respective verification schemes may be applied to program MLCs, QLCs, PLCs, or any other types of memory cells.

During each loop of a program operation, when applying a program pulse 430 to the selected word line 118 to program memory cells coupled to the selected word line 118, a pass voltage is applied to other word lines 118 that are not selected for programming. In the following, different program operations are described with further details in FIGS. 5 to 12B and 14A to 16. One or more of the program operations can be implemented in a memory device, e.g., the memory device 100 of FIG. 1 or 3, or a memory device 1804 of FIG. 18, 19A or 19B.

Figure 5:
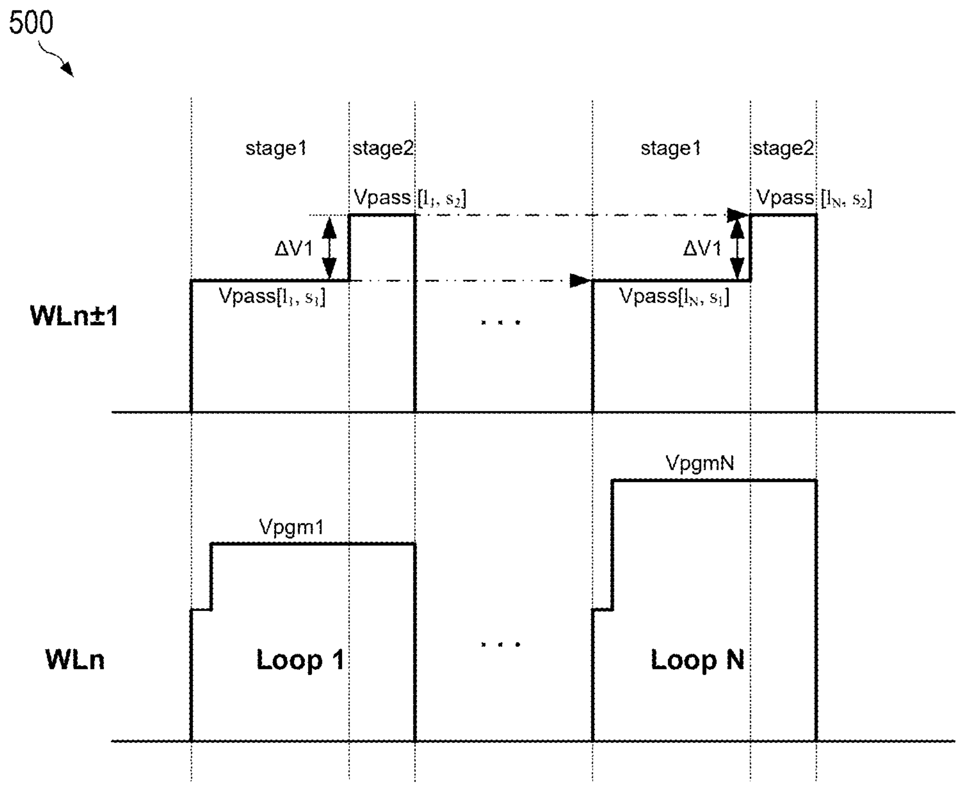
FIG. 5 illustrates an example of voltages of components in a block during an example program operation of the block.

FIG. 5 illustrates an example of voltages of components in a block (e.g., block 104 of FIG. 1) during an example program operation 500 of the block. The program operation 500 can include N loops (e.g., Loop1-LoopN).

During a first loop (e.g., Loop1) of the program operation 500, a program pulse having a first program voltage (e.g., Vpgm1) is applied to the selected word line (e.g., WLn, where n is a positive integer). In some implementations, it takes some time for the voltage on the selected word line to ramp up to Vpgm1. Loop1 can include a first stage and a second stage. During the first stage of Loop1, a pass voltage (Vpass[$l_1$, $s_1$]) is applied to at least one adjacent word line (e.g., WLn+1 and/or WLn−1 referring to as WLn±1) that is adjacent to the selected word line. During the second stage of Loop1, a pass voltage (Vpass[$l_1$, $s_2$]) is applied to the at least one adjacent word line. Vpass[$l_1$, $s_2$] is higher than Vpass[$l_1$, $s_1$]. The second stage is after the first stage. After the first stage and the second stage, a verification pulse can be applied to the selected word line to verify whether the memory cells have been programmed to the target programed state. The verification pulse is also included in Loop1. For illustration purposes, the verification pulse is not shown in each loop in the following figures.

During a later loop (e.g., LoopN) that is after the first loop of the program operation 500, a program pulse having a higher program voltage (e.g., VpgmN) is applied to the selected word line. LoopN can also include a first stage and a second stage. During the first stage of LoopN, a pass voltage (Vpass[$l_N$, $s_1$]) is applied to the at least one adjacent word line. During the second stage of LoopN, a pass voltage (Vpass[$l_N$, $s_2$]) is applied to the at least one adjacent word line. Vpass[$l_N$, $s_1$] is equal to Vpass[$l_1$, $s_1$], and Vpass[$l_N$, $s_2$] is equal to Vpass[$l_1$, $s_2$]. In some implementations, during the first stage of all the loops of the program operation 500, equal pass voltages are applied to the at least one adjacent word line, and during the second stage of all the loops of the program operation 500, equal pass voltages are applied to the at least one adjacent word line.

In some implementations, due to the coupling effect from the at least one adjacent word line, in the same loop, the voltage of the selected word line during the second stage can be higher than the voltage of the selected word line during the first stage. For example, the voltage of the selected word line during the second stage of Loop1 can be higher than Vpgm1 applied to the selected word line. Similarly, the voltage of the selected word line during the second stage of LoopN can be higher than VpgmN.

Figure 6:
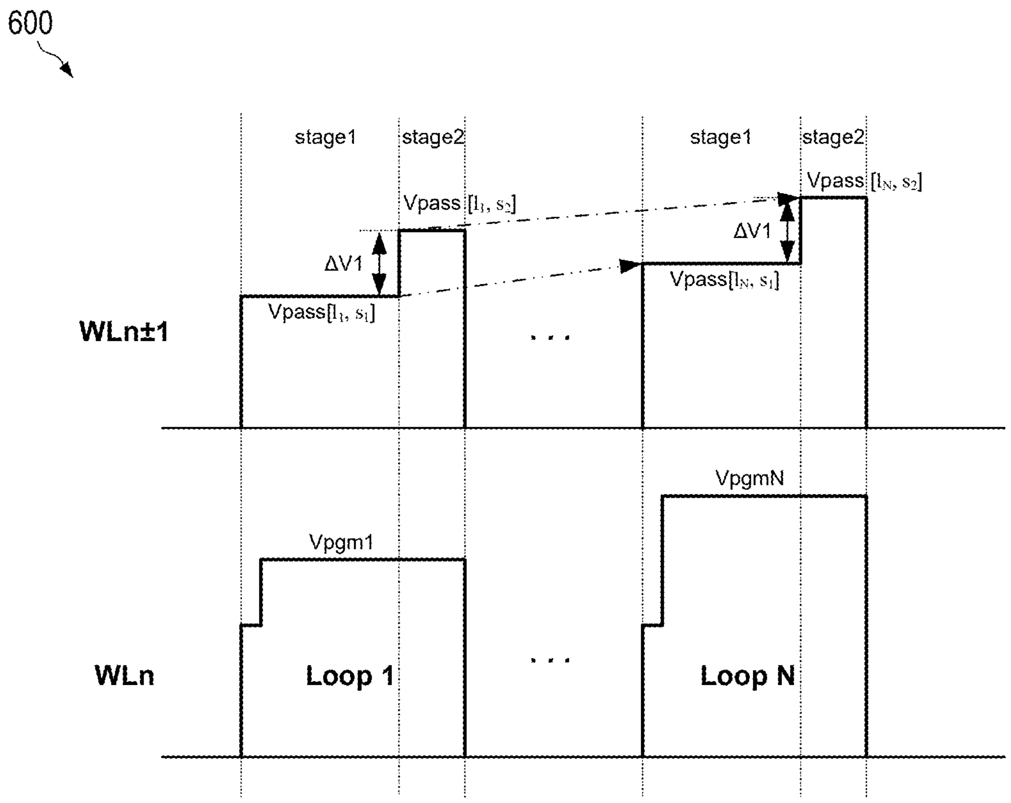
FIG. 6 illustrates an example of voltages of components in a block during another example program operation of the block.

FIG. 6 illustrates an example of voltages of components in a block (e.g., block 104 of FIG. 1) during an example program operation 600 of the block. The program operation 600 can include N loops (e.g., Loop1-LoopN).

Similar to the program operation 500, during a first loop (Loop1) of the program operation 600, Vpgm1 is applied to the selected word line (e.g., WLn). During the first stage of Loop1, a pass voltage (Vpass[$l_1$, $s_1$]) is applied to at least one adjacent word line (e.g., WLn±1). During the second stage of Loop1, a pass voltage (Vpass[$l_1$, $s_2$]) is applied to the at least one adjacent word line. Vpass[$l_1$, $s_2$] is higher than Vpass[$l_1$, $s_1$]. During a later loop (e.g., LoopN) of the program operation 600, a higher program voltage (e.g., VpgmN) is applied to the selected word line. During the first stage of LoopN, a pass voltage (Vpass[$l_N$, $s_1$]) is applied to the at least one adjacent word line. During the second stage of LoopN, a pass voltage (Vpass[$l_N$, $s_2$]) is applied to the at least one adjacent word line. Vpass[$l_N$, $s_2$] is higher than Vpass[$l_N$, $s_1$].

Different from the program operation 500, in the program operation 600, Vpass[$l_N$, $s_1$] is higher than Vpass[$l_1$, $s_1$], and Vpass[$l_N$, $s_2$] is higher than Vpass[$l_1$, $s_2$], while the difference between Vpass[$l_N$, $s_2$] and Vpass[$l_N$, $s_1$] is equal to the difference between Vpass[$l_1$, $s_2$] and Vpass[$l_1$, $s_1$]. In some implementations, as the program operation 600 progresses from Loop1 to LoopN, the pass voltage applied to the at least one adjacent word line during the first stage increases, the pass voltage applied to the at least one adjacent word line during the second stage also increases, while the difference between the pass voltage applied during the second stage and the pass voltage applied during the first stage remains constant.

Figure 7A:
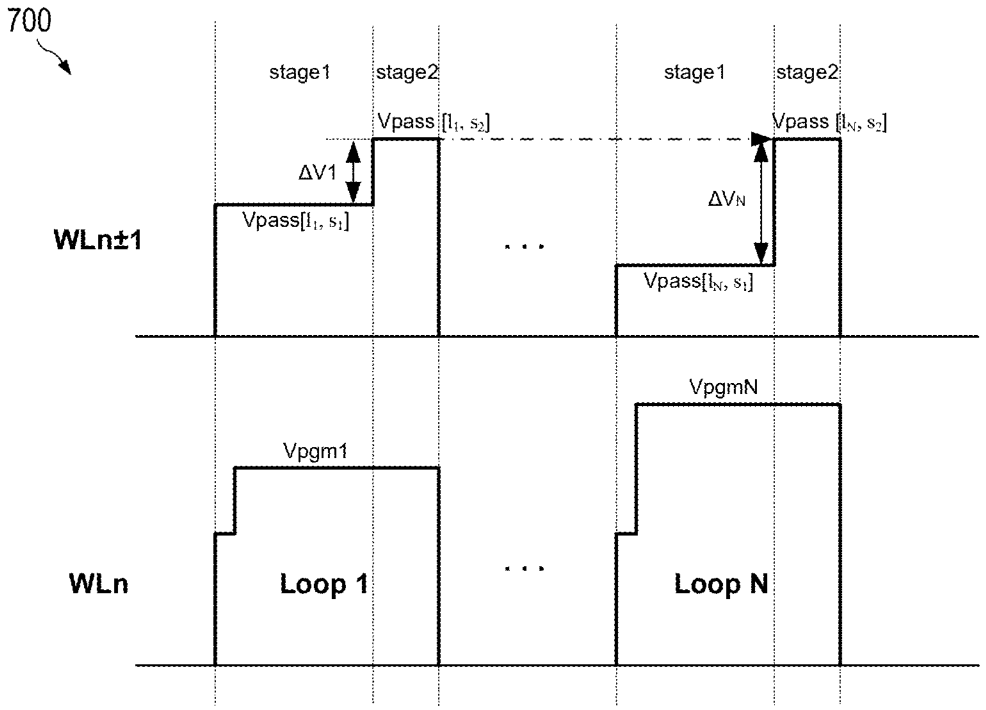
FIG. 7A illustrates an example of voltages of components in a block during yet another example program operation of the block.

FIG. 7A illustrates an example of voltages of components in a block (e.g., block 104 of FIG. 1) during an example program operation 700 of the block. The program operation 700 can include N loops (e.g., Loop1-LoopN).

Similar to the program operations 500 and 600, during a first loop (Loop1) of the program operation 700, Vpgm1 is applied to the selected word line (e.g., WLn). During the first stage of Loop1, a pass voltage (Vpass[$l_1$, $s_1$]) is applied to at least one adjacent word line (e.g., WLn±1). During the second stage of Loop1, a pass voltage (Vpass[$l_1$, $s_2$]) is applied to the at least one adjacent word line. Vpass[$l_1$, $s_2$] is higher than Vpass[$l_1$, $s_1$]. The difference between Vpass[$l_1$, $s_2$] and Vpass[$l_1$, $s_1$] is $\Delta V_1$. During a later loop (e.g., LoopN) of the program operation 700, a higher program voltage (e.g., VpgmN) is applied to the selected word line. During the first stage of LoopN, a pass voltage (Vpass[$l_N$, $s_1$]) is applied to the at least one adjacent word line. During the second stage of LoopN, a pass voltage (Vpass[$l_N$, $s_2$]) is applied to the at least one adjacent word line. Vpass[$l_N$, $s_2$] is higher than Vpass[$l_N$, $s_1$]. The difference between Vpass[$l_N$, $s_2$] and Vpass[$l_N$, $s_1$] is $\Delta V_N$.

Different from the program operations 500 and 600, in the program operation 700, Vpass[$l_N$, $s_1$] is lower than Vpass[$l_1$, $s_1$], and Vpass[$l_N$, $s_2$] is equal to Vpass[$l_1$, $s_2$], so that $\Delta V_N$ is greater than $\Delta V_1$. In some implementations, as the program operation 700 progresses from Loop1 to LoopN, the pass voltage applied during the first stage decreases, and the pass voltage applied during the second stage remains constant, so that the difference ($\Delta V$) between the pass voltage applied during the second stage and the pass voltage applied during the first stage increases.

In some implementations, the pass voltage applied during the first stage of the later loop is between 3V and 5V, and the pass voltage applied during the second stage of the later loop is between 6V and 8V. For example, in the later loop, the pass voltage applied during the first stage can be 50%-80% of the pass voltage applied during the second stage.

Figure 7B:
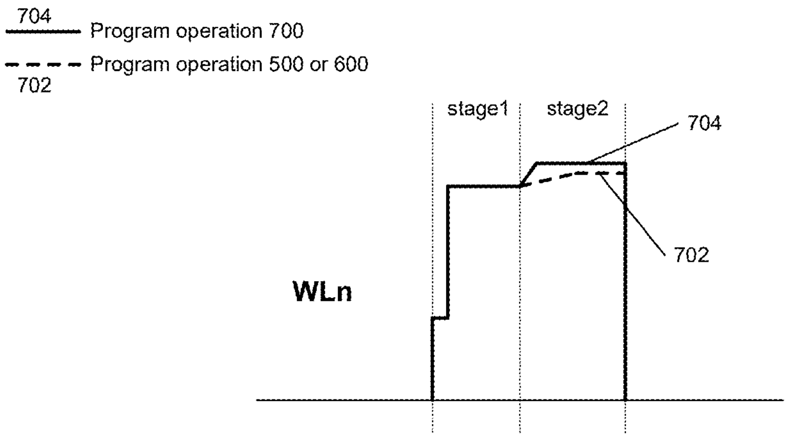
FIG. 7B illustrates an example voltage of a selected word line during the example program operation of FIG. 7A.

FIG. 7B illustrates an example voltage of the selected word line during the program operation 700. Compared to the program operation 500 or 600, where $\Delta V$ remains constant for all the loops, in the program operation 700, $\Delta V$ of the later loop is greater than the first loop. As such, the coupling effect from the at least one adjacent word line is stronger in the later loop than in the first loop. As shown in FIG. 7B, due to the stronger coupling effect, the voltage of the selected word line during the second stage of the later loop (e.g., loop N) of the program operation 700 is higher as shown by plot 704, as compared to the voltage of the selected word line during the second stage of the later loop (e.g., loop N) of the program operation 500 or 600 as shown by plot 702. As an example, the voltage of the selected word line can be 2%-15% higher than the program voltage applied to the selected word line. Further, the voltage of the selected word line can ramp up faster during the second stage of the later loop of the program operation 700, as shown by plot 704. As an example, if the pulse length of the program pulse of the later loop is 20 μs, in the program operation 500 or 600, the voltage on the selected word line is higher than a threshold for only 10 μs to 12 μs, while in the program operation 700, the voltage on the selected word line can be higher than the threshold for 15 μs or longer, as the voltage of the selected word line ramps up faster.

Figure 8A:
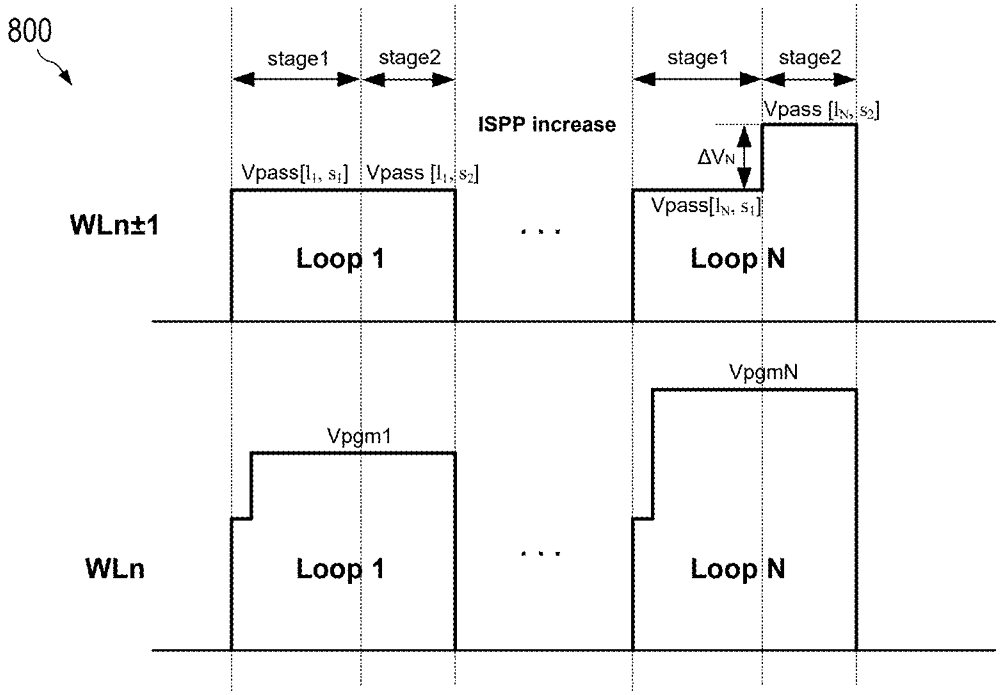
FIG. 8A illustrates an example of voltages of components in a block during an example program operation of the block.

FIG. 8A illustrates an example of voltages of components in a block (e.g., block 104 of FIG. 1) during an example program operation 800 of the block. The program operation 800 can include N loops (e.g., Loop1-LoopN).

Similar to the program operation 700, in the program operation 800, the difference between Vpass[$l_1$, $s_2$] and Vpass[$l_1$, $s_1$] of the first loop is $\Delta V_1$, the difference between Vpass[$l_N$, $s_2$] and Vpass[$l_N$, $s_1$] of the later loop (e.g., LoopN) is $\Delta V_N$, and $\Delta V_N$ is greater than $\Delta V_1$.

Different from the program operation 700, in the program operation 800, Vpass[$l_N$, $s_1$] is equal to Vpass[$l_N$, $s_1$], and Vpass[$l_N$, $s_2$] is higher than Vpass[$l_1$, $s_2$], so that $\Delta V_N$ can be greater than $\Delta V_1$. In some implementations, as the program operation 800 progresses from Loop1 to LoopN, the pass voltage applied during the first stage remains constant, and the pass voltage applied during the second stage increases, so that the difference (ΔV) between the pass voltage applied during the second stage and during the first stage increases.

In some implementations, as shown in FIG. 8A, in the first loop, Vpass[$l_1$, $s_2$] can be equal to Vpass[$l_1$, $s_1$]. That is, $\Delta V_1$ can be zero.

Figure 8B:
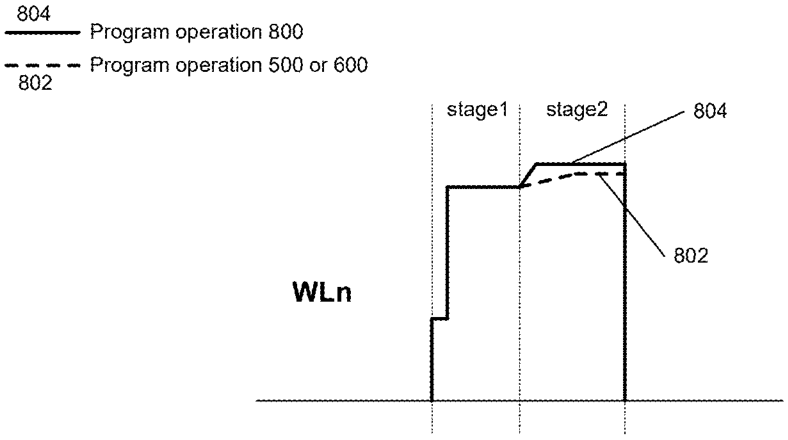
FIG. 8B illustrates an example voltage of a selected word line during the example program operation of FIG. 8A.

FIG. 8B illustrates an example voltage of the selected word line during the program operation 800. Similar to the effect of the program operation 700 shown in FIG. 7B, in the program operation 800, since ΔV of the later loop is greater than the first loop, the coupling effect is stronger in the later loop than in the first loop. As shown in FIG. 8B, compared to the program operation 500 or 600 as shown by plot 802, the voltage of the selected word line during the second stage of the later loop (e.g., loop N) of the program operation 800 can ramp up faster to a higher voltage as shown by plot 804.

Figure 9A:
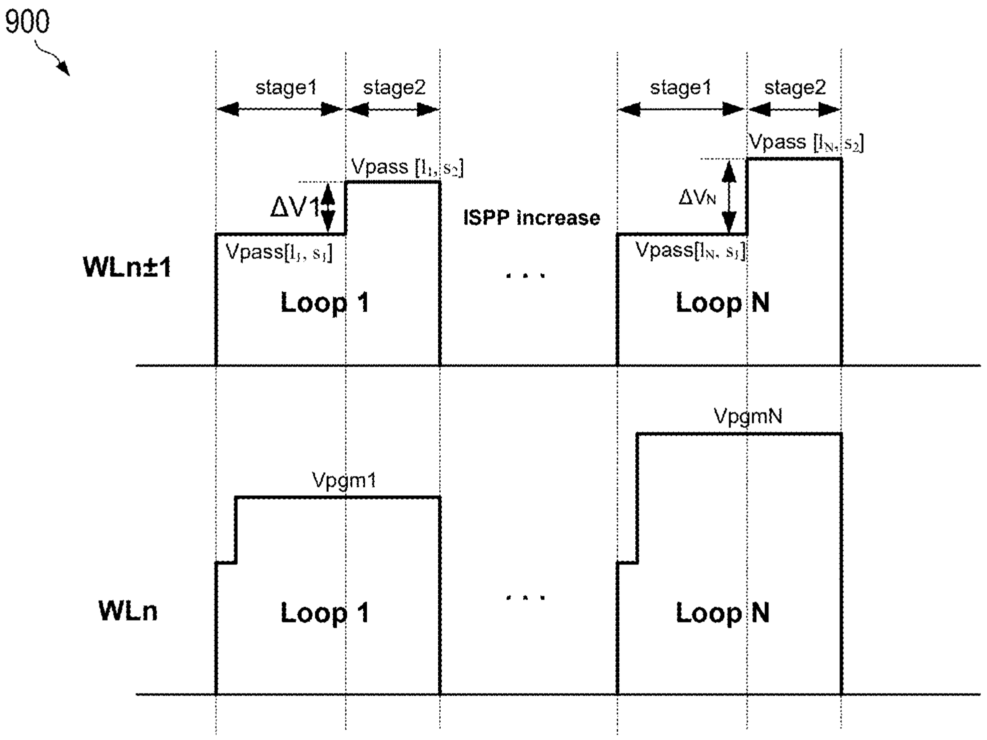
FIG. 9A illustrates an example of voltages of components in a block during an example program operation of the block.

FIG. 9A illustrates an example of voltages of components in a block (e.g., block 104 of FIG. 1) during an example program operation 900 of the block. The program operation 900 can include N loops (e.g., Loop1-LoopN).

The voltage conditions in the program operation 900 are identical to that of the program operation 800, except that Vpass[$l_1$, $s_2$] is higher than Vpass[$l_1$, $s_1$]. A difference between the pass voltage applied during the first stage and the pass voltage applied during the second voltage in a loop can be increased while the program operation 900 progresses to later loops. For example, $\Delta V_N$ in LoopN is greater than $\Delta V_1$ in Loop1.

Figure 9B:
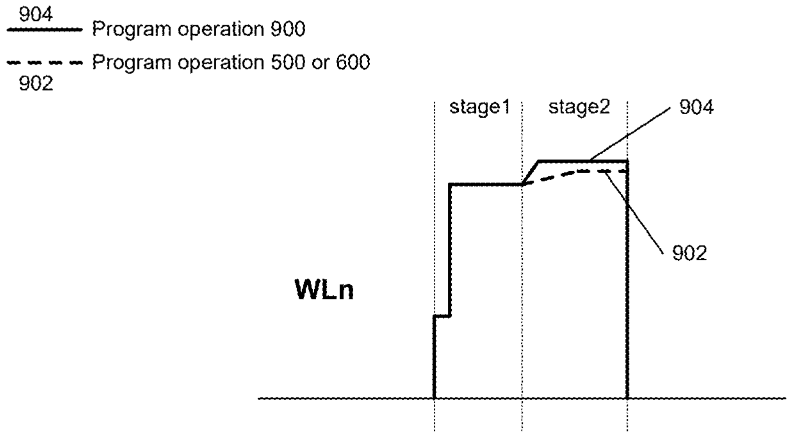
FIG. 9B illustrates an example voltage of a selected word line during the example program operation of FIG. 9A.

FIG. 9B illustrates an example voltage of the selected word line during the program operation 900. The program operation 900 can achieve similar effects as the program operation 800, such that, compared to the program operation 500 or 600 as shown by plot 902, the voltage of the selected word line during the second stage of the later loop (e.g., loop N) can ramp up faster to a higher voltage as shown by plot 904.

Figure 10A:
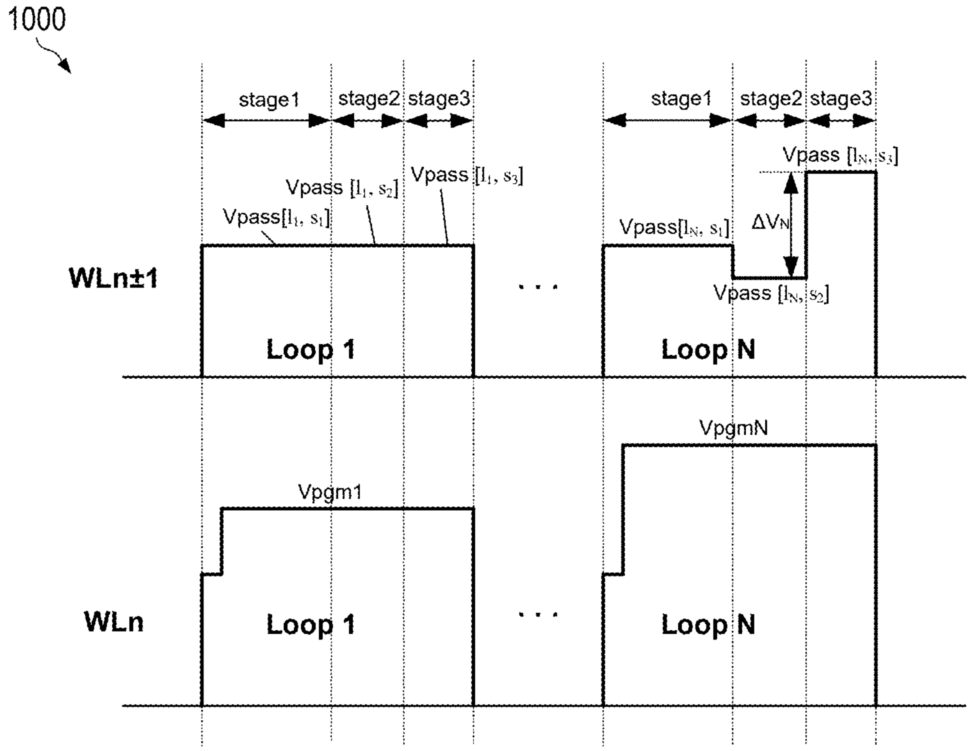
FIG. 10A illustrates an example of voltages of components in a block during an example program operation of the block.

FIG. 10A illustrates an example of voltages of components in a block (e.g., block 104 of FIG. 1) during an example program operation 1000 of the block. The program operation 1000 can include N loops (e.g., Loop1-LoopN). Each loop can include a first stage, a second stage after the first stage, and a third stage after the second stage. By having more stages in each loop, the pass voltage applied to the adjacent word line can be more flexible, for example, to balance program time, which can be reduced by a stronger coupling effect of higher pass voltage on adjacent word lines, and program interference, which can be aggravated by the higher pass voltage on adjacent word lines.

During a first loop (e.g., Loop1) of the program operation 1000, a program pulse having a first program voltage (e.g., Vpgm1) is applied to the selected word line (e.g., WLn). During the first stage of Loop1, a pass voltage (Vpass[$l_1$, $s_1$]) is applied to at least one adjacent word line (e.g., WLn±1) that is adjacent to the selected word line. During the second stage of Loop 1, a pass voltage (Vpass[$l_1$, $s_2$]) is applied to the at least one adjacent word line. During the third stage of Loop1, a pass voltage (Vpass[$l_1$, $s_3$]) is applied to the at least one adjacent word line. As shown in FIG. 10A, in some implementations, Vpass[$l_1$, $s_1$], Vpass[$l_1$, $s_2$], and Vpass[$l_1$, $s_3$] can be equal. After the third stage, a verification pulse can be applied to the selected word line.

During a later loop (e.g., LoopN) of the program operation 1000, a program pulse having a higher program voltage (e.g., VpgmN) is applied to the selected word line. During the first stage of LoopN, a pass voltage (Vpass[$l_N$, $s_1$]) is applied to at least one adjacent word line. Vpass[$l_N$, $s_1$] is equal to Vpass[$l_1$, $s_1$]. During the second stage of LoopN, a pass voltage (Vpass[$l_N$, $s_2$]) is applied to the at least one adjacent word line. Vpass[$l_N$, $s_2$] is lower than Vpass[$l_1$, $s_2$]. During the third stage of LoopN, a pass voltage (Vpass[$l_N$, $s_3$]) is applied to the at least one adjacent word line. Vpass[$l_N$, $s_3$] is higher than Vpass[$l_1$, $s_3$]. In some implementations, the difference between Vpass[$l_1$, $s_2$] and Vpass[$l_N$, $s_2$] is smaller than the difference between Vpass[$l_N$, $s_3$] and Vpass[$l_1$, $s_3$].

In some implementations, as the program operation 1000 progresses from Loop1 to LoopN, the pass voltage applied during the first stage remains constant, the pass voltage applied during the second stage decreases, and the pass voltage applied during the third stage increases. As such, the difference between the pass voltage applied during the third stage and during the second stage increases.

Figure 10B:
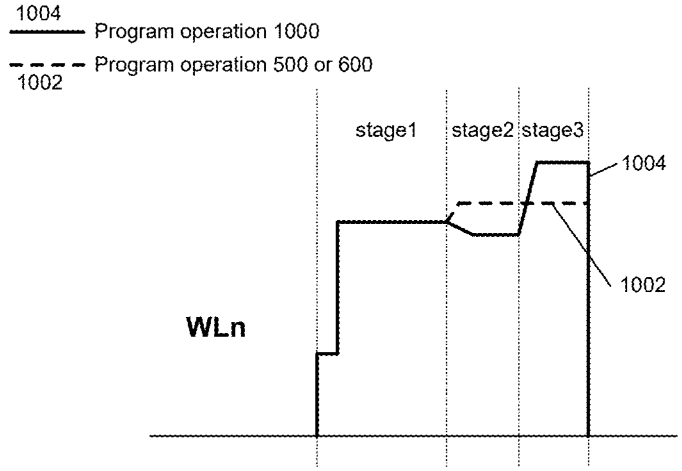
FIG. 10B illustrates an example voltage of a selected word line during the example program operation of FIG. 10A.

FIG. 10B illustrates an example voltage of the selected word line during the program operation 1000. As shown in FIG. 10B, by lowering the pass voltage applied during the second stage in later loops, which can cause the voltage of the selected word line during the second stage can be lower than the first stage as shown by plot 1004, interference between the selected word line and adjacent word lines can be reduced. By increasing the pass voltage applied during the third stage in later loops, the coupling effect from the adjacent word lines can be enhanced, so that the voltage of the selected word line during the third stage can ramp up faster to a higher voltage, as compared to the program operation 500 or 600 as shown by plot 1002.

Figure 11A:
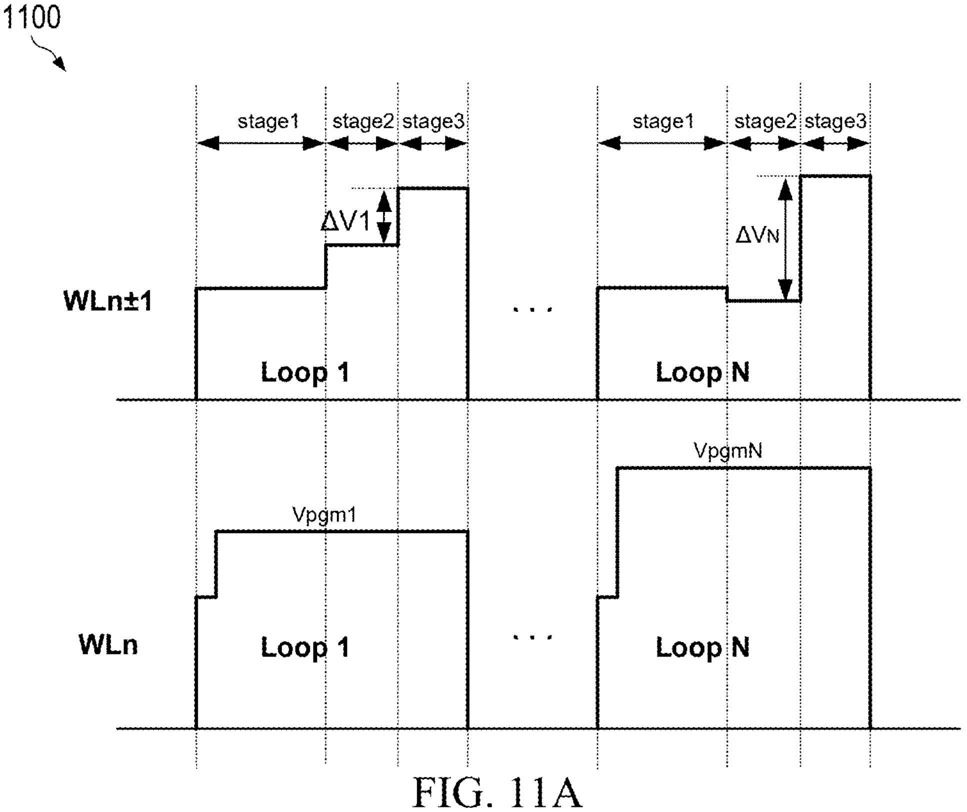
FIG. 11A illustrates an example of voltages of components in a block during an example program operation of the block.

FIG. 11A illustrates an example of voltages of components in a block (e.g., block 104 of FIG. 1) during an example program operation 1100 of the block. The program operation 1100 can include N loops (e.g., Loop1-LoopN).

The voltage conditions in the program operation 1100 are identical to that of the program operation 1000, except that during the first loop, Vpass[$l_1$, $s_3$] is higher than Vpass[$l_1$, $s_2$], and Vpass[$l_1$, $s_2$] is higher than Vpass[$l_1$, $s_1$].

Figure 11B:
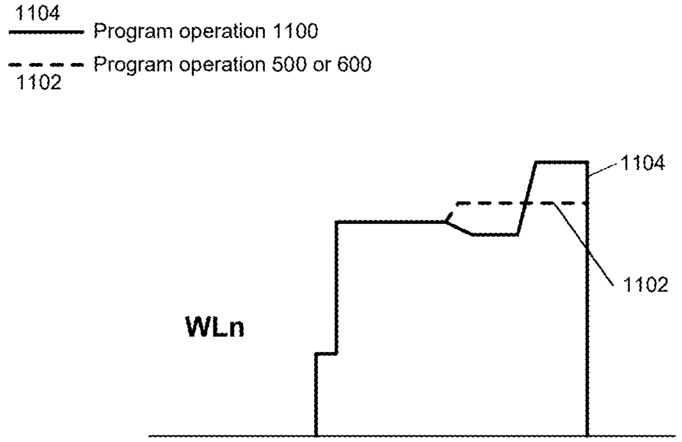
FIG. 11B illustrates an example voltage of a selected word line during the example program operation of FIG. 11A.

FIG. 11B illustrates an example voltage of the selected word line during the program operation 1100. The program operation 1100 can achieve similar effects as the program operation 1000, such that, when compared to the program operation 500 or 600 as shown by plot 1102, the voltage of the selected word line during the second stage of the later loop (e.g., loop N) can be lower, and the voltage of the selected word line during the third stage can ramp up faster to a higher voltage, as shown by plot 1104.

Figure 12A:
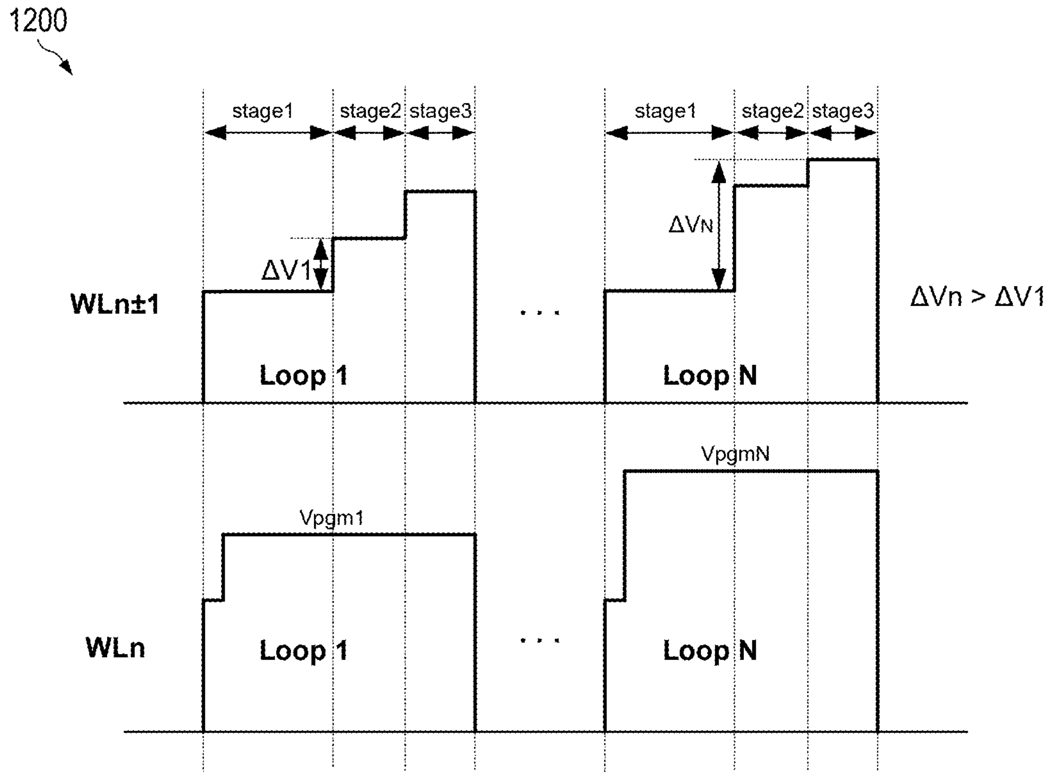
FIG. 12A illustrates an example of voltages of components in a block during an example program operation of the block.

FIG. 12A illustrates an example of voltages of components in a block (e.g., block 104 of FIG. 1) during an example program operation 1200 of the block. The program operation 1200 can include N loops (e.g., Loop1-LoopN). Similar to the program operations 1000 and 1100, loops of the program operation 1200 each include three stages.

Different from the program operation 1100, in the program operation 1200, the pass voltage (Vpass[$l_N$, $s_2$]) applied to the at least one adjacent word line during the second stage of a later loop (e.g., LoopN) is higher than the pass voltage (Vpass[$l_1$, $s_2$]) applied to the at least one adjacent word line during the second stage of the first loop. The difference between Vpass[$l_N$, $s_2$] and Vpass[$l_N$, $s_1$] is greater than the difference between Vpass[$l_1$, $s_2$] and Vpass[$l_1$, $s_1$].

In some implementations, as the program operation 1200 progresses from Loop1 to LoopN, the pass voltage applied during the first stage remains constant, the pass voltage applied during the second stage increases, and the pass voltage applied during the third stage increases. As such, the difference between the pass voltage applied during the second stage and during the first stage increases.

Figure 12B:
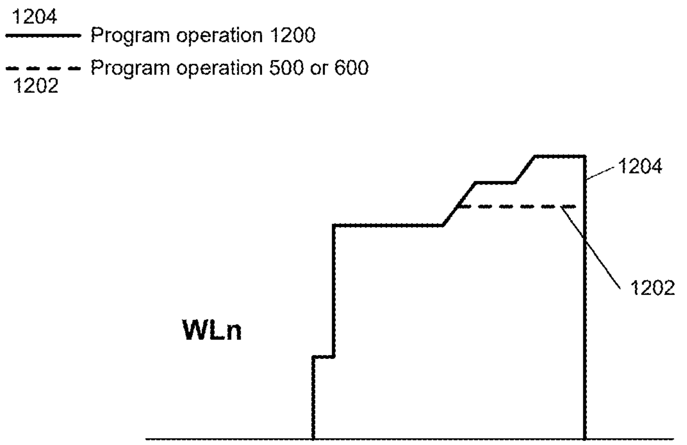
FIG. 12B illustrates an example voltage of a selected word line during the example program operation of FIG. 12A.

FIG. 12B illustrates an example voltage of the selected word line during the program operation 1200. By increasing the difference between the pass voltages applied during the second stage and during the first stage in later loops, the coupling effect from adjacent word lines can be enhanced, so that the voltage of the selected word line during the second stage can ramp up faster to a higher voltage as shown by plot 1204, as compared to the program operation 500 or 600 as shown by plot 1202. Further, the voltage of the selected word line during the third stage can ramp up an even higher voltage.

Figure 13:
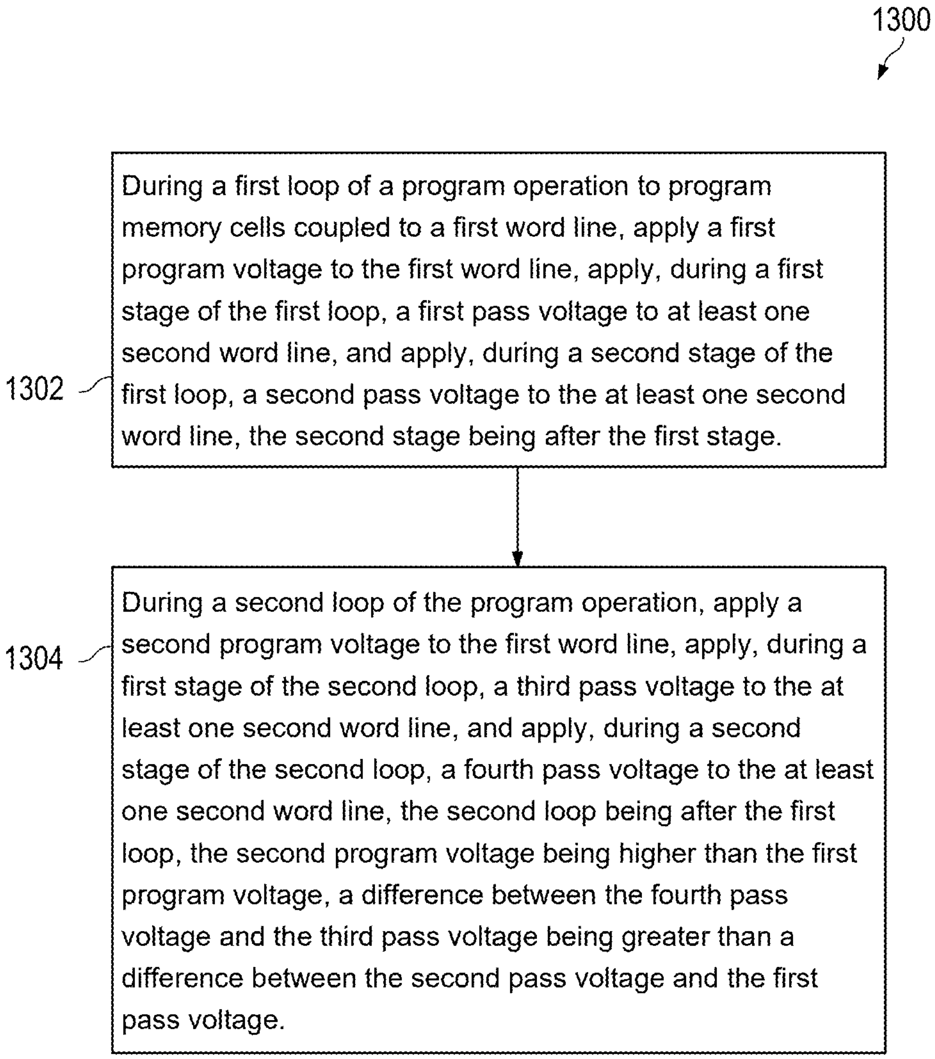
FIG. 13 illustrates a flow chart of an example process for performing an example program operation in a memory device.

FIG. 13 illustrates a flow chart of an example process 1300 for performing an example program operation in a memory device. Process 1300 can be performed by any suitable device or system as described herein, for example, according to the example techniques described with respect to FIGS. 1-12. For example, process 1300 can be performed by a memory device, such as the memory device 100 of FIGS. 1-3 that includes a memory array 101, or the memory device 1804 of FIGS. 18, 19A-19B. The memory array 101 can include one or more blocks 104. In some implementations, the memory device can also include peripheral circuits (e.g., peripheral circuits 102 of FIG. 1). The memory device can be a part of a memory system, such as memory system 1802 of FIG. 18. The program operation (e.g., the program operation 700, 800, 900, 1000, 1100, or 1200) can be performed based on an ISPP scheme (e.g., ISPP scheme 420 of FIG. 4A) and include a plurality of loops (e.g., Loop1 to LoopN).

At 1302, during a first loop (e.g., Loop1) of the program operation to program memory cells coupled to a first word line (e.g., WLn), a first program voltage (e.g., Vpgm1) is applied to the first word line. The first loop can include a first stage and a second stage after the first stage. During a first stage of the first loop, a first pass voltage (e.g., Vpass[$l_1$, $s_1$]) is applied to at least one second word line (e.g., one or more of WLn+1 or WLn−1). During a second stage of the first loop, a second pass voltage (e.g., Vpass[$l_1$, $s_2$]) is applied to the at least one second word line.

At 1304, during a second loop (e.g., LoopN) of the program operation, a second program voltage (e.g., VpmgN) is applied to the first word line. The first loop can include a first stage and a second stage after the first stage. During a first stage of the second loop, a third pass voltage (e.g., Vpass[$l_N$, $s_1$]) is applied to the at least one second word line. During a second stage of the second loop, a fourth pass voltage (e.g., Vpass[$l_N$, $s_2$]) is applied to the at least one second word line. The second loop is after the first loop. The second program voltage is higher than the first program voltage. A difference between the fourth pass voltage and the third pass voltage is greater than a difference between the second pass voltage and the first pass voltage.

In some implementations, the at least one second word lines can include one or more of word lines having an order number adjacent to the selected word line, e.g., WLn+1, WLn−1, WLn+2, WLn−2 (or WLn±1 or WLn±2), to further enhance the coupling effect on the selected word line WLn.

In some implementations, as the program operation progresses from Loop1 to LoopN, the pass voltage applied during the first stage decreases, and the pass voltage applied during the second stage remains constant, so that the difference (ΔV) between the pass voltage applied during the second stage and the pass voltage applied during the first stage increases.

In some implementations, as the program operation progresses from Loop1 to LoopN, the pass voltage applied during the first stage remains constant, and the pass voltage applied during the second stage increases, so that the difference (ΔV) between the pass voltage applied during the second stage and the pass voltage applied during the first stage increases.

In some implementations, as the program operation progresses from Loop1 to LoopN, the difference (ΔV) between the pass voltage applied during the second stage and the pass voltage applied during the first stage increases. For example, ΔV increases by every loop, such that $\Delta V_1 < \Delta V_2 < \ldots < \Delta V_N$, where $\Delta V_x$ stands for the difference between the pass voltage applied during the second stage and the pass voltage applied during the first stage of the $x^{th}$ loop. For another example, ΔV of loops in the same loop group (e.g., early loops, middle loops, or terminal loops) remains constant, while ΔV increases by the loop group. For instance, $\Delta V_1 = \Delta V_2 = \ldots = \Delta V_{K-1} < \Delta V_K = \Delta V_{k+1} = \ldots = \Delta V_{Q-1} < \Delta V_Q = \Delta V_{Q+1} = \ldots = \Delta V_N$, where Loop1 to LoopK−1 are early loops, LoopK LoopQ−1 are middle loops, and LoopQ to ΔVN are terminal loops.

In some implementations, each loop can include more than two stages, such as three stages, as shown in FIGS. 10-12. The pass voltage applied on the at least one adjacent word lines during each loop can be more flexible, to balance the need to reduce program time and the need to reduce program interference.

The operations shown in process 1300 may not be exhaustive and that other operations can be performed as well before, after, or in between any of the illustrated operations. Further, some of the operations may be performed simultaneously, or in a different order than shown in FIG. 13. In some implementations, some of the operations may be performed by or one or more components of a device or a system, such as, a peripheral circuit of the memory device.

Figure 14A:
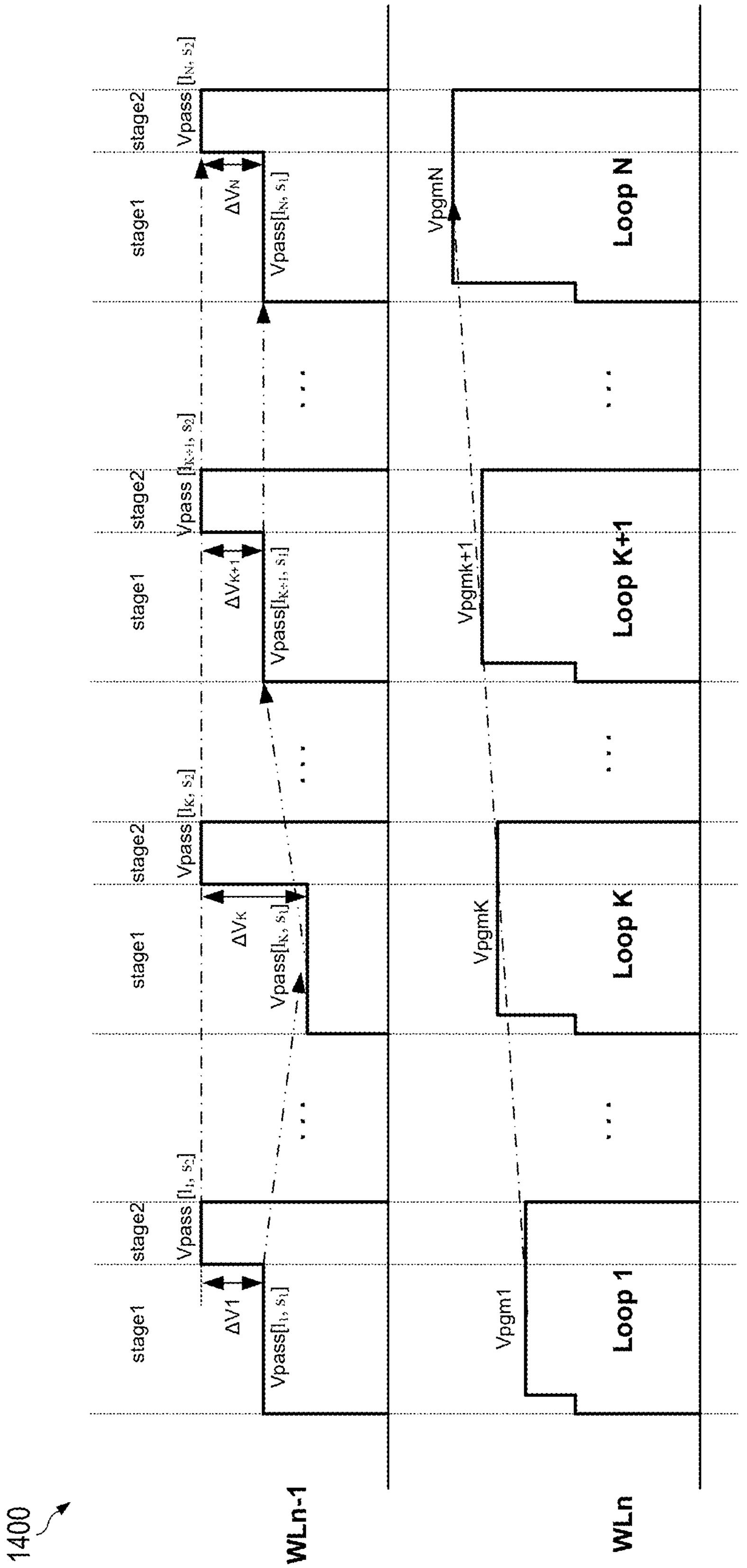
FIG. 14A illustrates an example of voltages of components in a block during an example program operation of the block.

FIG. 14A illustrates an example of voltages of components in a block (e.g., block 104 of FIG. 1) during an example program operation 1400 of the block. The program operation 1400 can include N loops (e.g., Loop1-LoopN).

Referring back to FIG. 7A, in the program operation 700, from Loop1 to LoopN, the program voltage applied on the selected word line (e.g., WLn) increases, and the pass voltage applied on the at least one adjacent word line during the first stage decreases. As such, as the program operation 700 progresses to a later loop, the voltage difference between the selected word line and the adjacent word line during the first stage increases, which may increase the risk of breaking down the memory cells being programmed, especially in terminal loops where the program voltage is relatively high.

In the program operation 1400, from Loop1 to LoopN, the program voltage applied on the selected word line (e.g., WLn) increases. During the first stage of Loop1, a pass voltage (Vpass[$l_1$, $s_1$]) is applied to at least one adjacent word line (e.g., WLn±1). During the second stage of Loop1, a pass voltage (Vpass[$l_1$, $s_2$]) is applied to the at least one adjacent word line. Vpass[$l_1$, $s_2$] is higher than Vpass[$l_1$, $s_1$]. The difference between Vpass[$l_1$, $s_2$] and Vpass[$l_1$, $s_1$] is $\Delta V_1$. During LoopK (1<K<N), a pass voltage (Vpass[$l_K$, $s_1$]) is applied during the first stage, and a pass voltage (Vpass [$l_K$, $s_2$]) is applied during the second stage. The difference between Vpass[$l_K$, $s_2$] and Vpass[$l_K$, $s_1$] is $\Delta V_K$. Vpass[$l_K$, $s_1$] is lower than Vpass[$l_1$, $s_1$]), and Vpass[$l_K$, $s_2$] is equal to Vpass[$l_1$, $s_2$]), so that $\Delta V_K$ is greater than $\Delta V_1$. During LoopK+1, a pass voltage (Vpass[$l_{K+1}$, $s_1$]) is applied during the first stage, and a pass voltage (Vpass[$l_{K+1}$, $s_2$]) is applied during the second stage. The difference between Vpass[$l_{K+1}$, $s_2$] and Vpass[$l_{K+1}$, $s_1$] is $\Delta V_{K+1}$. Vpass[$l_{K+1}$, $s_1$] is higher than Vpass[$l_K$, $s_1$], and Vpass[$l_{K+1}$, $s_2$] is equal to Vpass[$l_K$, $s_2$], so that $\Delta V_{K+1}$ is smaller than $\Delta V_K$. During LoopN, a pass voltage (Vpass[$l_N$, $s_1$]) is applied during the first stage, and a pass voltage (Vpass[$l_N$, $s_2$]) is applied during the second stage. The difference between Vpass[$l_N$, $s_2$] and Vpass[$l_N$, $s_1$] is $\Delta V_N$. Vpass[$l_N$, $s_1$] is equal to Vpass[$l_{K+1}$, $s_1$], Vpass[$l_N$, $s_2$] is equal to Vpass[$l_{K+1}$, $s_2$], and $\Delta V_N$ is equal to $\Delta V_{K+1}$.

Similar to the effect of the program operation 700 as shown in FIG. 7B, ΔV of the pass voltage applied during the second stage and the first stage of each loop can have a coupling effect on the selected word line, so that the voltage of the selected word line during the second stage can be higher than that of the first stage.

In some implementations, from Loop1 to LoopK, the pass voltage applied to at least one adjacent word line (e.g., WLn±1) during the first stage decreases, and the pass voltage applied to the at least one adjacent word line during the second stage remains constant. As such, the difference (ΔV) between the pass voltage applied during the second stage and the pass voltage applied during the first stage increases, to enhance the coupling effect. From LoopK+1 to LoopN, the pass voltage applied during the first stage remains constant, and the pass voltage applied during the second stage continues to remain constant, so that ΔV remains constant. As such, the voltage difference between the selected word line and the adjacent word line can be controlled to a lower value, as compared to the program operation 700.

In some implementations, LoopK can be determined based on performance of the memory device. For example, in a TLC memory device, the loop during which the memory cells are successfully programmed to the programed state P6 can be determined as LoopK. For another example, in a QLC memory device, the loop during which the memory cells are successfully programmed to the programed state P14 can be determined as LoopK.

Figure 14B:
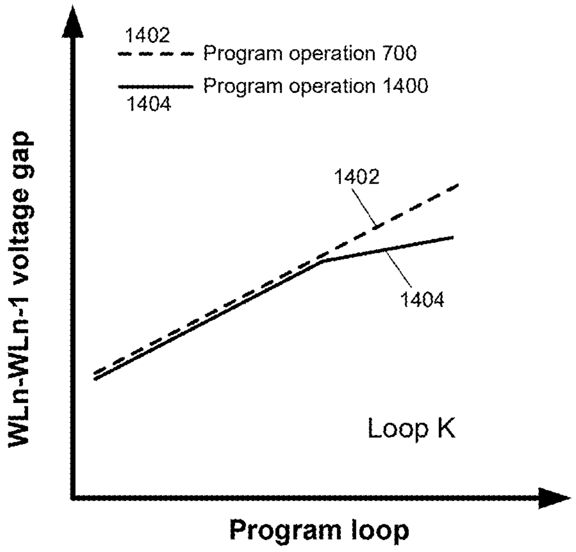
FIG. 14B illustrates an example voltage difference between selected word line and adjacent word line.

FIG. 14B illustrates an example voltage difference between the selected word line and the adjacent word line. As shown in FIG. 14B, the voltage difference between the selected word line and the adjacent word line after LoopK in the program operation 1400 is lower as shown by plot 1404, compared to that of the program operation 700 as shown by plot 1402. As such, the risk of breaking down the memory cells can be reduced.

Figure 15:
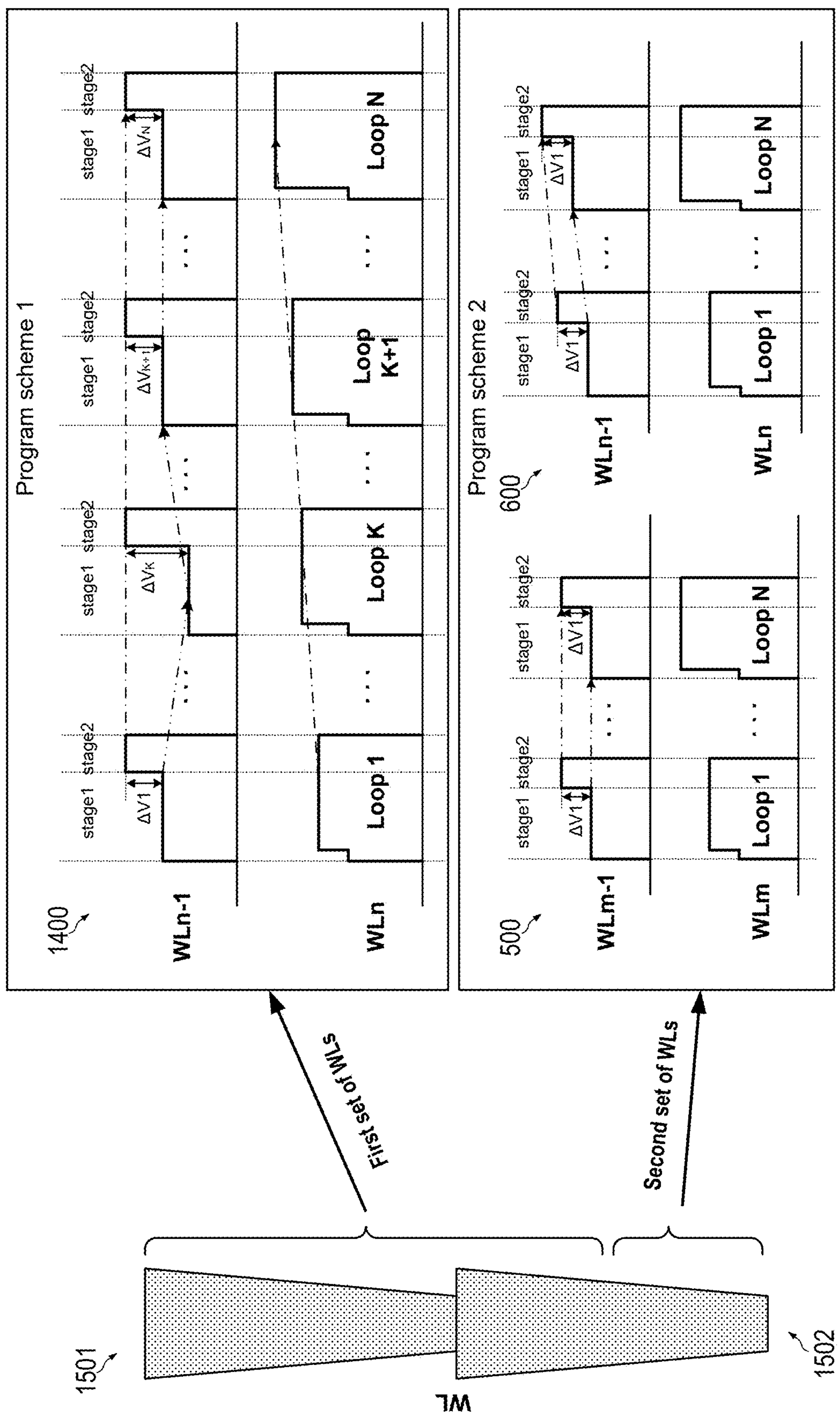
FIGS. 15-16 illustrate example of voltages of components in a memory device.
Figure 16:
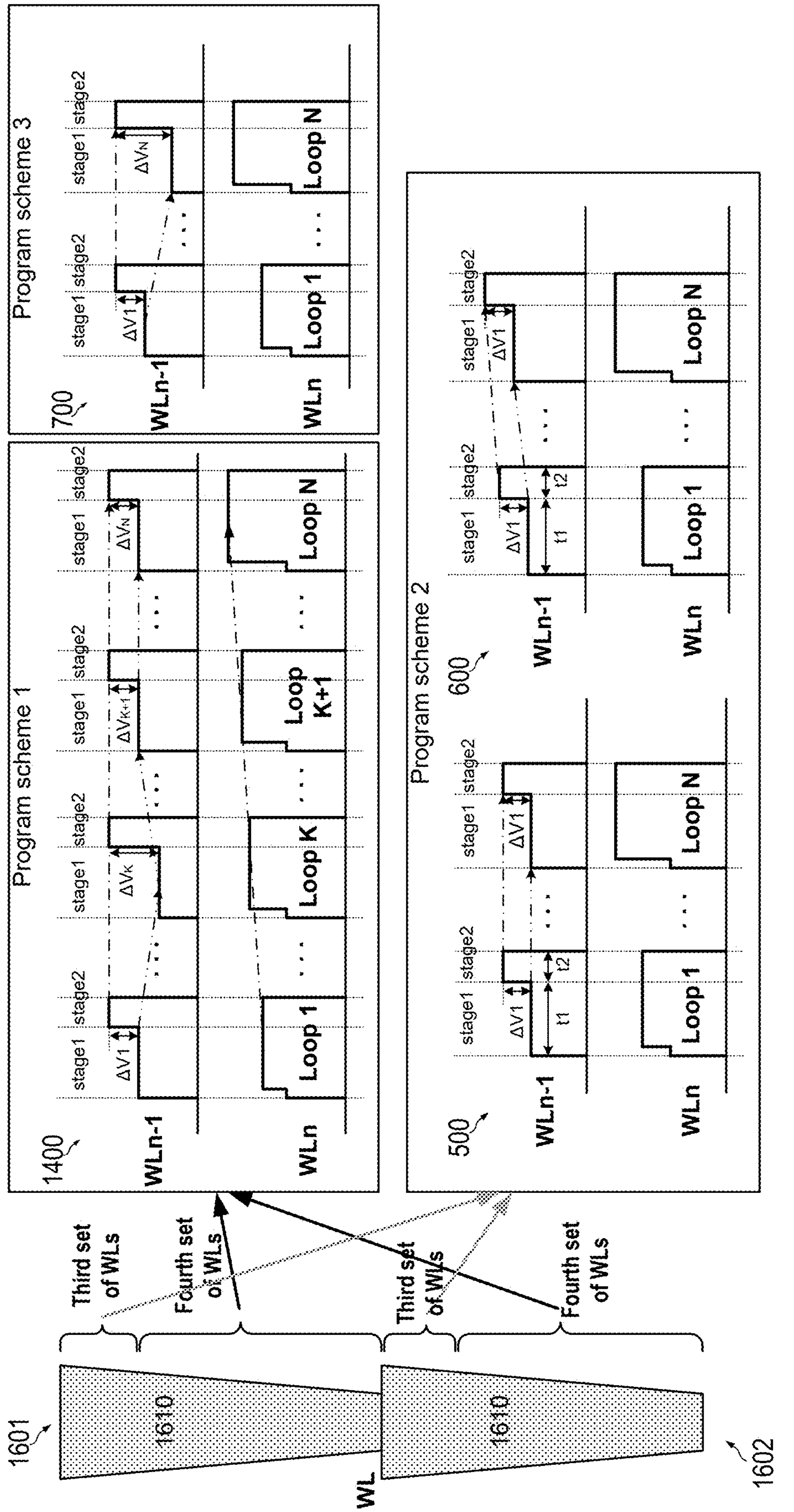
Figure 18:
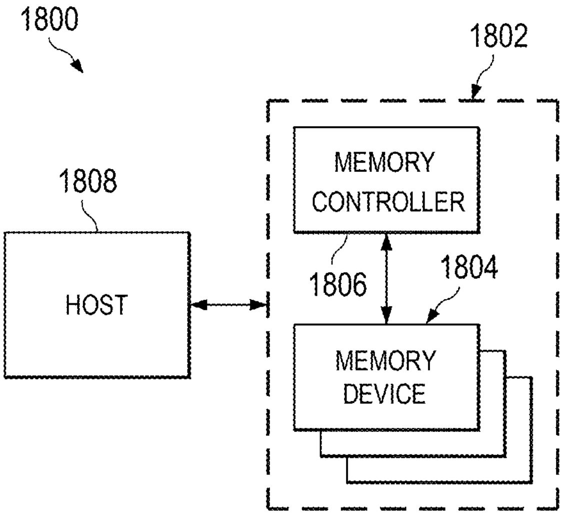
FIG. 18 illustrates a block diagram of an example system having a memory device, according to some aspects of the present disclosure.
Figure 19A:
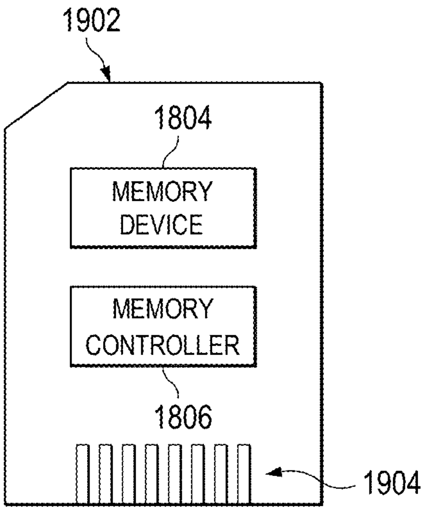
FIG. 19A illustrates a diagram of a memory card having a memory device, according to some aspects of the present disclosure.
Figure 19B:
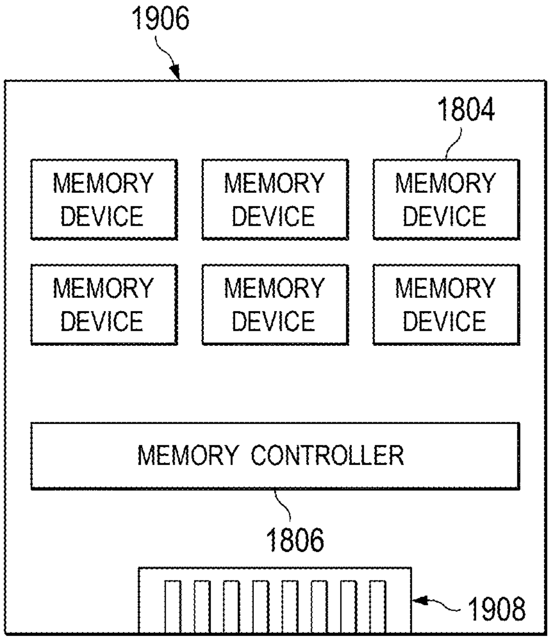
FIG. 19B illustrates a diagram of a solid-state drive (SSD) having a memory device, according to some aspects of the present disclosure.

FIGS. 15-16 illustrate an example of voltages of components in a memory device (e.g., memory device 100 of FIG. 1 or the memory device 1804 of FIGS. 18, 19A-19B). The memory device can include word lines arranged from a first side 1501 (e.g., a top side that is further away from the substrate) of a memory stack (e.g., the memory stack 204) to a second side 1502 (e.g., a bottom side that is closer to the substrate) of the memory stack along a vertical direction. In some implementations, the memory device can implement different program schemes to program memory cells coupled to different word lines.

In some implementations, as shown in FIG. 15, word lines in the memory stack can be grouped based on susceptibility to program interference. A second set of word lines are more susceptible to program interference than a first set of word lines. In some cases, the word lines that are closer to the second side 1502 of the memory stack can be more susceptible to program interference. As an example, the second set of word lines can include about 10 word lines that are closest to the second side 1502 of the memory stack among all word lines in the memory stack, and the first set of word lines can include the rest of the word lines. When programming the first set of word lines, the memory device can implement the program scheme of program operation 1400 as shown in FIG. 14A. When programming the second set of word lines, the memory device can implement the program scheme of program operation 500 as shown in FIG. 5, or the program operation 600 as shown in FIG. 6. As such, program interference can be reduced to reduce read margin loss of the memory pages associated with the second set of word lines.

In some implementations, as shown in FIG. 16, word lines in the memory stack can be grouped based on breakdown risk. Memory cells coupled to a word line of a third set of word lines have a higher risk of breaking down than memory cells coupled to a word line of a fourth set of word lines. In some cases, the memory stack can include a plurality of decks 1610. Each deck 1610 can have a first side 1601 (e.g., a top side that is further away from the substrate) and a second side (e.g., a bottom side that is closer to the substrate). For example, the third set of word lines can include a number of word lines (e.g., about 10 word lines) that are closest to the first side 1601 in each deck 1610, and the fourth set of word lines can include the rest of the word lines. When programming the third set of word lines, the memory device can implement the program scheme of program operation 500 as shown in FIG. 5, or the program operation 600 as shown in FIG. 6. When programming the second set of word lines, the memory device can implement the program scheme of program operation 1400 as shown in FIG. 14A, or the program operation 700 as shown in FIG. 7A. As such, the breakdown risk of the memory cells coupled to the third set of word lines can be reduced.

Figure 17:
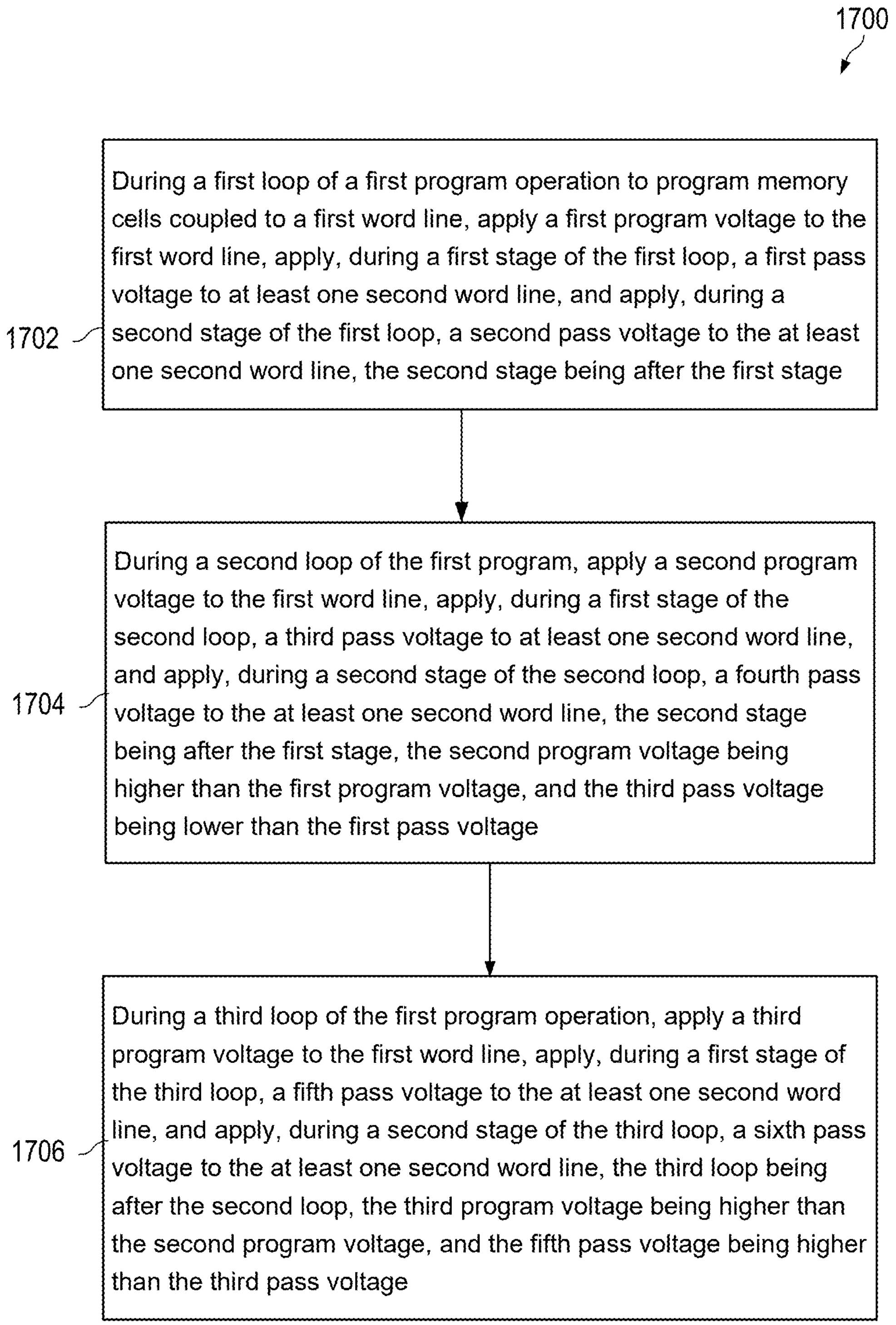
FIG. 17 illustrates a flow chart of an example process of programming a memory device.

FIG. 17 illustrates a flow chart of an example process 1700 of programming a memory device. Process 1700 can be performed by any suitable device or system as described herein, for example, according to the example techniques described with respect to FIGS. 1-16. For example, process 1700 can be performed by a memory device, such as the memory device 100 of FIGS. 1-3 that includes a memory array 101, or the memory device 1804 of FIGS. 18, 19A-19B. In some implementations, the memory device can also include peripheral circuits (e.g., peripheral circuits 102 of FIG. 1). The memory device can be a part of a memory system, such as memory system 1802 of FIG. 18. Program operations can be performed based on an ISPP scheme (e.g., ISPP scheme 420 of FIG. 4A) and include a plurality of loops (e.g., Loop1 to LoopN).

At 1702, during a first loop (e.g. Loop1) of a first program operation (e.g., program operation 1400 of FIGS. 14A, 15, and 16) to program memory cells coupled to a first word line (e.g., WLn), a first program voltage (e.g., Vpgm1 of FIG. 14A) is applied to the first word line. The first loop can include a first stage and a second stage after the first stage. During a first stage of the first loop, a first pass voltage (e.g., Vpass[$l_1$, $s_1$] of FIG. 14A) is applied to at least one second word line (e.g., one or more of WLn+1 or WLn−1). During a second stage of the first loop, a second pass voltage (e.g., Vpass[$l_1$, $s_2$] of FIG. 14A) is applied to the at least one second word line.

At 1704, during a second loop (e.g., LoopK) of the first program operation, a second program voltage (e.g., VpmgK of FIG. 14A) is applied to the first word line. The second loop can include a first stage and a second stage after the first stage. During a first stage of the second loop, a third pass voltage (e.g., Vpass[$l_K$, $s_1$] of FIG. 14A) is applied to the at least one second word line. During a second stage of the second loop, a fourth pass voltage (e.g., Vpass[$l_K$ $s_2$] of FIG.

14A) is applied to the at least one second word line. The second loop is after the first loop. The second program voltage is higher than the first program voltage. The third pass voltage is lower than the first pass voltage.

At 1706, during a third loop (e.g., LoopK+1 of FIG. 14A) of the first program operation, a third program voltage (e.g., VpmgK+1 of FIG. 14A) is applied to the first word line. The third loop can include a first stage and a second stage after the first stage. During a first stage of the third loop, a fifth pass voltage (e.g., Vpass[$l_{K+1}$, $s_1$] of FIG. 14A) is applied to the at least one second word line. During a second stage of the third loop, a sixth pass voltage (e.g., Vpass[$l_{K+1}$, $s_2$] of FIG. 14A) is applied to the at least one second word line. The third loop is after the second loop. The third program voltage is higher than the second program voltage. The fifth pass voltage is higher than the third pass voltage.

In some implementations, the second pass voltage, the fourth pass voltage and the sixth pass voltage are identical.

In some implementations, a difference between the second pass voltage and the first pass voltage is smaller than a difference between the fourth pass voltage and the third pass voltage, and the difference between the fourth pass voltage and the third pass voltage is greater than a difference between the sixth pass voltage and the fifth pass voltage.

In some implementations, word lines in a memory device can be divided in to a first set of word lines and a second set of word lines. The first word line belongs to the first set of word lines. During a second program operation (e.g., program operation 500 or 600 of FIGS. 15-16) to program memory cells coupled to a third word line that belongs to the second set of word lines, the memory device can implement a different program scheme than the program scheme of the first program operation.

During a first loop (e.g., Loop1) of the second program operation to program memory cells coupled to the third word line, a fourth program voltage (e.g., Vpgm1 of FIG. 6) is applied to the third word line. The first loop of the second program operation can include a first stage and a second stage after the first stage. During a first stage of the first loop of the second program operation, a seventh pass voltage (e.g., Vpass[$l_1$, $s_1$] of FIG. 6) is applied to at least one fourth word line that is adjacent to the third word line. During a second stage of the first loop of the second program operation, an eighth pass voltage (e.g., Vpass[$l_1$, $s_2$] of FIG. 6) is applied to the at least one fourth word line.

During a second loop (e.g., a loop between Loop1 and LoopN of FIG. 6) of the second program operation, a fifth program voltage is applied to the third word line. The second loop of the second program operation can include a first stage and a second stage after the first stage. During a first stage of the second loop of the second program operation, a ninth pass voltage is applied to the at least one fourth word line. During a second stage of the second loop of the second program operation, a tenth pass voltage is applied to the at least one fourth word line. The second loop is after the first loop.

During a third loop (e.g., LoopN of FIG. 6) of the second program operation, a third program voltage (e.g., VpmgN of FIG. 6) is applied to the third word line. The third loop of the second program operation can include a first stage and a second stage after the first stage. During a first stage of the third loop of the second program operation, an eleventh pass voltage (e.g., Vpass[$l_N$, $s_1$] of FIG. 6) is applied to the at least one fourth word line. During a second stage of the third loop of the second program operation, a twelfth pass voltage (e.g., Vpass[$l_N$, $s_2$] of FIG. 6) is applied to the at least one fourth word line. The first loop, the second loop, and the third loop of the second program operation are sequential to each other. The fifth program voltage is higher than the fourth program voltage, and the sixth program voltage is higher than the fifth program voltage. A difference between the eighth pass voltage and the seventh pass voltage, a difference between the tenth pass voltage and the ninth pass voltage, and a difference between the twelfth pass voltage and the eleventh pass voltage are identical to each other.

The operations shown in process 1700 may not be exhaustive and that other operations can be performed as well before, after, or in between any of the illustrated operations. Further, some of the operations may be performed simultaneously, or in a different order than shown in FIG. 17. In some implementations, some of the operations may be performed by or one or more components of a device or a system, such as, a peripheral circuit of the memory device.

FIG. 18 illustrates a block diagram of an example system 1800 having a memory device, according to some aspects of the present disclosure. System 1800 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. System 1800 can include a host 1808 and a memory system 1802 having one or more memory devices 1804 and a memory controller 1806. Host 1808 can be a processor of an electronic device, such as a central processing unit (CPU), or a system-on-chip (SoC), such as an application processor (AP). Host 1808 can be configured to send or receive data to or from memory devices 1804.

Memory device 1804 can be any memory device disclosed in the present disclosure. Memory controller 1806 is coupled to memory device 1804 and host 1808 and is configured to control the memory device 1804, according to some implementations. Memory controller 1806 can manage the data stored in memory device 1804 and communicate with host 1808. In some implementations, memory controller 1806 is designed for operating in a low duty-cycle environment like secure digital (SD) cards, compact Flash (CF) cards, universal serial bus (USB) Flash drives, or other media for use in electronic devices, such as personal computers, digital cameras, mobile phones, etc. In some implementations, memory controller 1806 is designed for operating in a high duty-cycle environment SSDs or embedded multi-media-cards (eMMCs) used as data storage for mobile devices, such as smartphones, tablets, laptop computers, etc., and enterprise storage arrays. Memory controller 1806 can be configured to control operations of memory device 1804, such as read, erase, and program operations. Memory controller 1806 can also be configured to manage various functions with respect to the data stored or to be stored in memory device 1804 including, but not limited to bad-block management, garbage collection, logical-to-physical address conversion, wear leveling, etc. In some implementations, memory controller 1806 is further configured to process error correction codes (ECCs) with respect to the data read from or written to memory device 1804. Any other suitable functions may be performed by memory controller 1806 as well, for example, formatting memory device 1804.

Memory controller 1806 can communicate with an external device (e.g., host 1808) according to a particular communication protocol. For example, memory controller 1806 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Memory controller 1806 and one or more memory devices 1804 can be integrated into various types of storage devices. For example, memory controller 1806 and one or more memory devices 1804 can be packaged in a universal Flash storage (UFS) package or an eMMC package. In one example as shown in FIG. 19A, memory controller 1806 and a single memory device 1804 may be integrated into a memory card 1902. Memory card 1902 can include a PC card (PCMCIA, personal computer memory card international association), a CF card, a smart media (SM) card, a memory stick, a multimedia card (MMC, RS-MMC, MMC-micro), an SD card (SD, miniSD, microSD, SDHC), a UFS, etc. Memory card 1902 can further include a memory card connector 1904 coupling memory card 1902 with a host (e.g., host 1808 in FIG. 18). In another example as shown in FIG. 19B, memory controller 1806 and multiple memory devices 1804 may be integrated into an SSD 1906. SSD 1906 can further include an SSD connector 1908 coupling SSD 1906 with a host (e.g., host 1808 in FIG. 18). In some implementations, the storage capacity and/or the operation speed of SSD 1906 is greater than those of memory card 1902.

While this specification contains many specific implementation details, these should not be construed as limitations on the scope of what may be claimed, but rather as descriptions of features that may be specific to particular implementations. Certain features that are described in this specification in the context of separate implementations can also be implemented, in combination, in a single implementation. Conversely, various features that are described in the context of a single implementation can also be implemented in multiple implementations, separately, or in any sub-combination. Moreover, although previously described features may be described as acting in certain combinations and even initially claimed as such, one or more features from a claimed combination can, in some cases, be excised from the combination, and the claimed combination may be directed to a sub-combination or variation of a sub-combination.

As used in this disclosure, the terms "a," "an," or "the" are used to include one or more than one unless the context clearly dictates otherwise. The term "or" is used to refer to a nonexclusive "or" unless otherwise indicated. The statement "at least one of A and B" has the same meaning as "A, B, or A and B." In addition, the phraseology or terminology employed in this disclosure, and not otherwise defined, is for the purpose of description only and not of limitation. Any use of section headings is intended to aid reading of the document and is not to be interpreted as limiting; information that is relevant to a section heading may occur within or outside of that particular section.

As used in this disclosure, the term "about" or "approximately" can allow for a degree of variability in a value or range, for example, within 10%, within 5%, or within 1% of a stated value or of a stated limit of a range.

As used in this disclosure, the term "substantially" refers to a majority of, or mostly, as in at least about 50%, 60%, 70%, 80%, 90%, 95%, 96%, 97%, 98%, 99%, 99.5%, 99.9%, 99.99%, or at least about 99.999% or more.

Values expressed in a range format should be interpreted in a flexible manner to include not only the numerical values explicitly recited as the limits of the range, but also to include all the individual numerical values or sub-ranges encompassed within that range as if each numerical value and sub-range is explicitly recited. For example, a range of "0.1% to about 5%" or "0.1% to 5%" should be interpreted to include about 0.1% to about 5%, as well as the individual values (for example, 1%, 2%, 3%, and 4%) and the sub-ranges (for example, 0.1% to 0.5%, 1.1% to 2.2%, 3.3% to 4.4%) within the indicated range. The statement "X to Y" has the same meaning as "about X to about Y," unless indicated otherwise. Likewise, the statement "X, Y, or Z" has the same meaning as "about X, about Y, or about Z," unless indicated otherwise.

Particular implementations of the subject matter have been described. Other implementations, alterations, and permutations of the described implementations are within the scope of the following claims as will be apparent to those skilled in the art. While operations are depicted in the drawings or claims in a particular order, such operations are not required be performed in the particular order shown or in sequential order, or that all illustrated operations be performed (some operations may be considered optional), to achieve desirable results. In certain circumstances, multitasking or parallel processing (or a combination of multitasking and parallel processing) may be advantageous and performed as deemed appropriate.

Moreover, the separation or integration of various system modules and components in the previously described implementations are not required in all implementations, and the described components and systems can generally be integrated together or packaged into multiple products.

Accordingly, the previously described example implementations do not define or constrain the present disclosure. Other changes, substitutions, and alterations are also possible without departing from the spirit and scope of the present disclosure.

What is claimed is:

1. A method of programming a memory device, comprising:

during a first loop of a first program operation to program memory cells coupled to a first word line:
- applying a first program voltage to the first word line;
- applying, during a first stage of the first loop, a first pass voltage to at least one second word line; and
- applying, during a second stage of the first loop, a second pass voltage to the at least one second word line, wherein the second stage is after the first stage; and during a second loop of the first program operation:
- applying a second program voltage to the first word line;
- applying, during a first stage of the second loop, a third pass voltage to the at least one second word line; and
- applying, during a second stage of the second loop, a fourth pass voltage to the at least one second word line, during a third loop of the first program operation:
- applying a third program voltage to the first word line;
- applying, during a first stage of the third loop, a fifth pass voltage to the at least one second word line; and
- applying, during a second stage of the third loop, a sixth pass voltage to the at least one second word line, wherein the second loop is after the first loop, the third loop is after the second loop, the second program voltage is higher than the first program voltage, and the third program voltage is higher than the second program voltage, and wherein the third pass voltage is lower than the first pass voltage, and the fifth pass voltage is higher than the third pass voltage.

2. The method of claim 1, wherein the memory device comprises word lines numbered in sequence, and wherein the first word line is the $n^{th}$ word line of the word lines, the at least one second word line comprises at least one of the $(n+1)^{th}$ or the $(n-1)^{th}$ word line of the word lines, where n is a positive integer.

3. The method of claim 1, wherein the second pass voltage, the fourth pass voltage and the sixth pass voltage are identical.

4. The method of claim 1, wherein a difference between the second pass voltage and the first pass voltage is smaller than a difference between the fourth pass voltage and the third pass voltage, and the difference between the fourth pass voltage and the third pass voltage is greater than a difference between the sixth pass voltage and the fifth pass voltage.

5. The method of claim 1, wherein a first voltage of the first word line during the first stage of the second loop is lower than a second voltage of the first word line during the second stage of the second loop.

6. The method of claim 1, comprising:

applying, during a first stage of a fourth loop of the first program operation, the fifth pass voltage to the at least one second word line, wherein the fourth loop is after the third loop.

7. The method of claim 1, comprising:

during a first loop of a second program operation to program memory cells coupled to a third word line:

applying a fourth program voltage to the third word line;

applying, during a first stage of the first loop of the second program operation, a seventh pass voltage to at least one fourth word line; and applying, during a second stage of the first loop of the second program operation, an eighth pass voltage to the at least one fourth word line, wherein the second stage is after the first stage;

during a second loop of the second program operation:

applying a fifth program voltage to the third word line;

applying, during a first stage of the second loop of the second program operation, a ninth pass voltage to the at least one fourth word line; and applying, during a second stage of the second loop of the second program operation, a tenth pass voltage to the at least one fourth word line; and during a third loop of the second program operation:

applying a sixth program voltage to the third word line;

applying, during a first stage of the third loop of the second program operation, an eleventh pass voltage to the at least one fourth word line; and applying, during a second stage of the third loop of the second program operation, a twelfth pass voltage to the at least one fourth word line, wherein the first loop, the second loop, and the third loop of the second program operation are sequential to each other, and wherein the fifth program voltage is higher than the fourth program voltage, and the sixth program voltage is higher than the fifth program voltage, and wherein a difference between the eighth pass voltage and the seventh pass voltage, a difference between the tenth pass voltage and the ninth pass voltage, and a difference between the twelfth pass voltage and the eleventh pass voltage are identical to each other.

8. The method of claim 7, wherein the seventh pass voltage, the ninth pass voltage and the eleventh pass voltage are identical to each other, and wherein the eighth pass voltage, the tenth pass voltage and the twelfth pass voltage are identical to each other.

9. The method of claim 7, wherein the ninth pass voltage is higher than the seventh pass voltage, and the eleventh pass voltage is higher than the ninth pass voltage, and wherein the tenth pass voltage is higher than the eighth pass voltage, and the twelfth pass voltage is higher than the tenth pass voltage.

10. The method of claim 7, wherein the memory device comprises word lines numbered in sequence, and wherein the third word line is the $m^{th}$ word line of the word lines, the at least one fourth word line comprises at least one of the $(m+1)^{th}$ or the $(m-1)^{th}$ word line of the word lines, where m is a positive integer.

11. The method of claim 7, wherein the memory device comprises word lines in sequence from a first side to a second side along a direction, and the word lines of the memory device comprise a first set of word lines and a second set of word lines, wherein the second set of word lines are closer to the second side of the memory device than the first set of word lines along the direction, and wherein the first set of word lines comprises the first word line, and the second set of word lines comprises the third word line.

12. The method of claim 11, wherein the second set of word lines comprise about 10 word lines.

13. The method of claim 7, wherein a deck of the memory device comprises a first side and a second side along a direction, and word lines of the deck comprise a third set of word lines and a fourth set of word lines, wherein the third set of word lines are closer to the first side of the deck than the fourth set of word lines, and wherein the third set of word lines comprises the third word line, and the fourth set of word lines comprises the first word line.

14. The method of claim 13, wherein the third set of word lines comprise about 10 word lines.

15. A memory device, comprising:

a memory array comprising a first word line and at least one second word line; and a peripheral circuit coupled to the memory array, wherein the peripheral circuit is configured to perform operations comprising:

during a first loop of a first program operation to program memory cells coupled to the first word line:

applying a first program voltage to the first word line;

applying, during a first stage of the first loop, a first pass voltage to the at least one second word line; and applying, during a second stage of the first loop, a second pass voltage to the at least one second word line, wherein the second stage is after the first stage; and during a second loop of the first program operation:

applying a second program voltage to the first word line;

applying, during a first stage of the second loop, a third pass voltage to the at least one second word line; and applying, during a second stage of the second loop, a fourth pass voltage to the at least one second word line, during a third loop of the first program operation:

applying a third program voltage to the first word line;

applying, during a first stage of the third loop, a fifth pass voltage to the at least one second word line; and applying, during a second stage of the third loop, a sixth pass voltage to the at least one second word line, wherein the second loop is after the first loop, the third loop is after the second loop, the second program voltage is higher than the first program voltage, and the third program voltage is higher than the second program voltage, and wherein the third pass voltage is lower than the first pass voltage, and the fifth pass voltage is higher than the third pass voltage.

16. The memory device of claim 15, wherein the memory device comprises word lines numbered in sequence, and wherein the first word line is the nth word line of the word lines, the at least one second word line comprises at least one of the (n+1)th or the (n−1)th word line of the word lines, where n is a positive integer.

17. The memory device of claim 15, wherein a difference between the second pass voltage and the first pass voltage is smaller than a difference between the fourth pass voltage and the third pass voltage, and the difference between the fourth pass voltage and the third pass voltage is greater than a difference between the sixth pass voltage and the fifth pass voltage.

18. The memory device of claim 15, wherein the operations further comprise:

during a first loop of a second program operation to program memory cells coupled to a third word line:

applying a fourth program voltage to the third word line;

applying, during a first stage of the first loop of the second program operation, a seventh pass voltage to at least one fourth word line; and applying, during a second stage of the first loop of the second program operation, an eighth pass voltage to the at least one fourth word line, wherein the second stage is after the first stage;

during a second loop of the second program operation:

applying a fifth program voltage to the third word line;

applying, during a first stage of the second loop of the second program operation, a ninth pass voltage to the at least one fourth word line; and applying, during a second stage of the second loop of the second program operation, a tenth pass voltage to the at least one fourth word line; and during a third loop of the second program operation:

applying a sixth program voltage to the third word line;

applying, during a first stage of the third loop of the second program operation, an eleventh pass voltage to the at least one fourth word line; and applying, during a second stage of the third loop of the second program operation, a twelfth pass voltage to the at least one fourth word line, wherein the first loop, the second loop, and the third loop of the second program operation are sequential to each other, and wherein the fifth program voltage is higher than the fourth program voltage, and the sixth program voltage is higher than the fifth program voltage, and wherein a difference between the eighth pass voltage and the seventh pass voltage, a difference between the tenth pass voltage and the ninth pass voltage, and a difference between the twelfth pass voltage and the eleventh pass voltage are identical to each other.

19. The memory device of claim 18, wherein the memory device comprises word lines numbered in sequence, and wherein the third word line is the $m^{th}$ word line of the word lines, the at least one fourth word line comprises at least one of the $(m+1)^{th}$ or the $(m-1)^{th}$ word line of the word lines, where m is a positive integer.

20. A memory system, comprising:

a memory device, comprising:

a memory array comprising a first word line and at least one second word line;

a peripheral circuit coupled to the memory array, wherein the peripheral circuit is configured to perform operations comprising:

during a first loop of a first program operation to program memory cells coupled to the first word line:

applying a first program voltage to the first word line;

applying, during a first stage of the first loop, a first pass voltage to the least one second word line; and applying, during a second stage of the first loop, a second pass voltage to the at least one second word line, wherein the second stage is after the first stage; and during a second loop of the first program operation:

applying a second program voltage to the first word line;

applying, during a first stage of the second loop, a third pass voltage to the at least one second word line; and applying, during a second stage of the second loop, a fourth pass voltage to the at least one second word line, during a third loop of the first program operation:

applying a third program voltage to the first word line;

applying, during a first stage of the third loop, a fifth pass voltage to the at least one second word line; and applying, during a second stage of the third loop, a sixth pass voltage to the at least one second word line, wherein the second loop is after the first loop, the third loop is after the second loop, the second program voltage is higher than the first program voltage, and the third program voltage is higher than the second program voltage, and wherein the third pass voltage is lower than the first pass voltage, and the fifth pass voltage is higher than the third pass voltage; and a memory controller coupled to the memory device and configured to control the memory device.

* * * * *